US010484630B2

(12) United States Patent
Keel et al.

(10) Patent No.: US 10,484,630 B2
(45) Date of Patent: Nov. 19, 2019

(54) IMAGE SENSOR INCLUDING FEEDBACK DEVICE TO REDUCE NOISE DURING RESET OPERATION

(71) Applicant: SAMSUNG ELECTRONICS CO., LTD., Suwon-si, Gyeonggi-do (KR)

(72) Inventors: Min-Sun Keel, Seoul (KR); Kyoungmin Koh, Hwaseong-si (KR); Sanghoon Ha, Seongnam-si (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 168 days.

(21) Appl. No.: 15/631,278

(22) Filed: Jun. 23, 2017

(65) Prior Publication Data
US 2018/0152653 A1 May 31, 2018

(30) Foreign Application Priority Data
Nov. 28, 2016 (KR) .................. 10-2016-0159662

(51) Int. Cl.
*H04N 5/363* (2011.01)
*H01L 27/146* (2006.01)
*H04N 5/345* (2011.01)
*H04N 5/355* (2011.01)
*H04N 5/357* (2011.01)
(Continued)

(52) U.S. Cl.
CPC ......... *H04N 5/363* (2013.01); *H01L 27/1461* (2013.01); *H01L 27/14609* (2013.01); *H01L 27/14612* (2013.01); *H01L 27/14636* (2013.01); *H01L 27/14645* (2013.01); *H04N 5/3452* (2013.01); *H04N 5/3559* (2013.01); *H04N 5/3575* (2013.01); *H04N 5/3698* (2013.01); *H04N 5/3745* (2013.01); *H04N 9/045* (2013.01); *H01L 27/1463* (2013.01); *H01L 27/14621* (2013.01); *H01L 27/14627* (2013.01); *H01L 27/14634* (2013.01)

(58) Field of Classification Search
CPC ...... H04N 5/363; H04N 9/045; H04N 5/3575; H04N 5/3559; H04N 5/3452; H01L 27/14612; H01L 27/14636; H01L 27/14609; H01L 27/1461; H01L 27/14645; H01L 27/1463; H01L 27/14627; H01L 27/14621; H01L 27/14634
See application file for complete search history.

(56) References Cited
U.S. PATENT DOCUMENTS
6,469,740 B1   10/2002   Kuroda et al.
7,417,676 B2   8/2008    Lee et al.
(Continued)

FOREIGN PATENT DOCUMENTS
JP   3008657       12/1999
JP   2014-236422   12/2014
KR   10-0651577    11/2006

Primary Examiner — Gevell V Selby
(74) Attorney, Agent, or Firm — F. Chau & Associates, LLC

(57) ABSTRACT

An image sensor includes a photoelectric device generating an electric charge from light; a feedback device generating a reset voltage using a predetermined reference voltage; and a pixel circuit generating a pixel voltage using the reset voltage and the electric charge, setting the reset voltage to the reference voltage using the feedback device a first period, and outputting the pixel voltage and the reset voltage during a second period.

21 Claims, 24 Drawing Sheets

(51) Int. Cl.
    *H04N 9/04*          (2006.01)
    *H04N 5/369*        (2011.01)
    *H04N 5/3745*      (2011.01)

(56) References Cited

U.S. PATENT DOCUMENTS

| | | |
|---|---|---|
| 9,319,609 B2 | 4/2016 | Kasuga et al. |
| 9,350,930 B2 | 5/2016 | Lee et al. |
| 2014/0131554 A1 | 5/2014 | Ishii et al. |
| 2015/0172573 A1* | 6/2015 | Wang .................. H04N 5/363 |
| | | 250/208.1 |
| 2015/0288898 A1* | 10/2015 | Yazawa ................ H04N 5/363 |
| | | 348/300 |
| 2016/0037099 A1* | 2/2016 | Mandelli ............... H04N 5/363 |
| | | 348/241 |
| 2016/0190187 A1* | 6/2016 | Nishimura ............ H04N 5/363 |
| | | 257/292 |
| 2016/0190188 A1 | 6/2016 | Murakami et al. |
| 2017/0295338 A1* | 10/2017 | Geurts ................. H04N 5/363 |

\* cited by examiner

IMAGE SENSOR INCLUDING FEEDBACK
DEVICE TO REDUCE NOISE DURING
RESET OPERATION

CROSS-REFERENCE TO RELATED
APPLICATION

This application claims the benefit of priority to Korean Patent Application No. 10-2016-0159662, filed on Nov. 28, 2016 in the Korean Intellectual Property Office, the disclosure of which is incorporated by reference in its entirety herein.

BACKGROUND

1. Technical Field

The present inventive concept relates to an image sensor.

2. Discussion of Related Art

Semiconductor-based image sensors generate electrical signals from received light and may include a pixel array having a plurality of pixels and a circuit driving the pixel array. Semiconductor-based image sensors have been widely used in smartphones, tablet PCs, laptop computers, televisions, and cameras. Each pixel in the pixel area may include multiple photoelectric devices generating an electric charge from light having different colors. However, when each pixel of an image sensor includes these multiple photoelectric devices, the images captured by the image sensor may be adversely affected by noise.

SUMMARY

At least one exemplary embodiment of the present inventive concept may provide an image sensor capable of minimizing an effect of a noise component and accurately reading out a pixel voltage and a reset voltage.

According to an exemplary embodiment of the present inventive concept, an image sensor includes a photoelectric device configured to generate an electric charge from light; a feedback device configured to generate a reset voltage using a predetermined reference voltage; and a pixel circuit configured to generate a pixel voltage using the reset voltage and the electric charge, set the reset voltage to the reference voltage using the feedback device during a first period, and output the pixel voltage and the reset voltage during a second period.

According to an exemplary embodiment of the present inventive concept, an image sensor comprises a pixel array, including a plurality of pixels arranged along a plurality of row lines and a plurality of column lines, each of the plurality of pixels having a photoelectric device receiving light and generating an electric charge, a feedback device generating a reset voltage, and a pixel circuit generating a pixel voltage using the electric charge and the reset voltage; a row driver configured to set the reset voltage to a predetermined reference voltage by activating the feedback device included in each of the plurality of pixels connected to a first row line among the plurality of row lines during a single horizontal period, and control each of the plurality of pixels connected to a second row line different from the first row line to output the pixel voltage and the reset voltage during the single horizontal period; and a sampling circuit configured to detect the pixel voltage and the reset voltage from each of the plurality of pixels connected to the second row line during the single horizontal period.

According to an exemplary embodiment of the present inventive concept, an image sensor comprises a pixel array including a plurality of pixels arrayed along a plurality of row lines and a plurality of column lines; a memory device configured to store a reset voltage detected from the plurality of pixels; a row driver configured to sequentially select a first row line and a second row line among the plurality of row lines during each horizontal period; a sampling circuit configured to reset first pixels connected to the first row line and detect a reset voltage from the first pixels while the first row line is selected, and detect a pixel voltage from second pixels connected to the second row line while the second row line is selected; and an arithmetic circuit configured to calculate a difference between the pixel voltage detected from the second pixels and the reset voltage of the second pixels stored in the memory device.

According to an exemplary embodiment of the present inventive concept, a driving apparatus for driving an image sensor is provided. The driving apparatus includes a driving circuit configured to drive the image sensor. The driving circuit sets a reset voltage applied to a first pixel of a first row of the image sensor to a reference voltage during a first period. The driving circuit outputs the reset voltage and a first pixel voltage of the first pixel during a second period. The driving circuit outputs the reset voltage applied to a second pixel of a second row of the image sensor and a second pixel voltage of the second pixel during the first period.

BRIEF DESCRIPTION OF DRAWINGS

The present inventive concept will be more clearly understood from the following detailed description when taken in conjunction with the accompanying drawings, in which.

DETAILED DESCRIPTION

Hereinafter, exemplary embodiments of the present inventive concept will be described with reference to the attached drawings.

Figure 1:
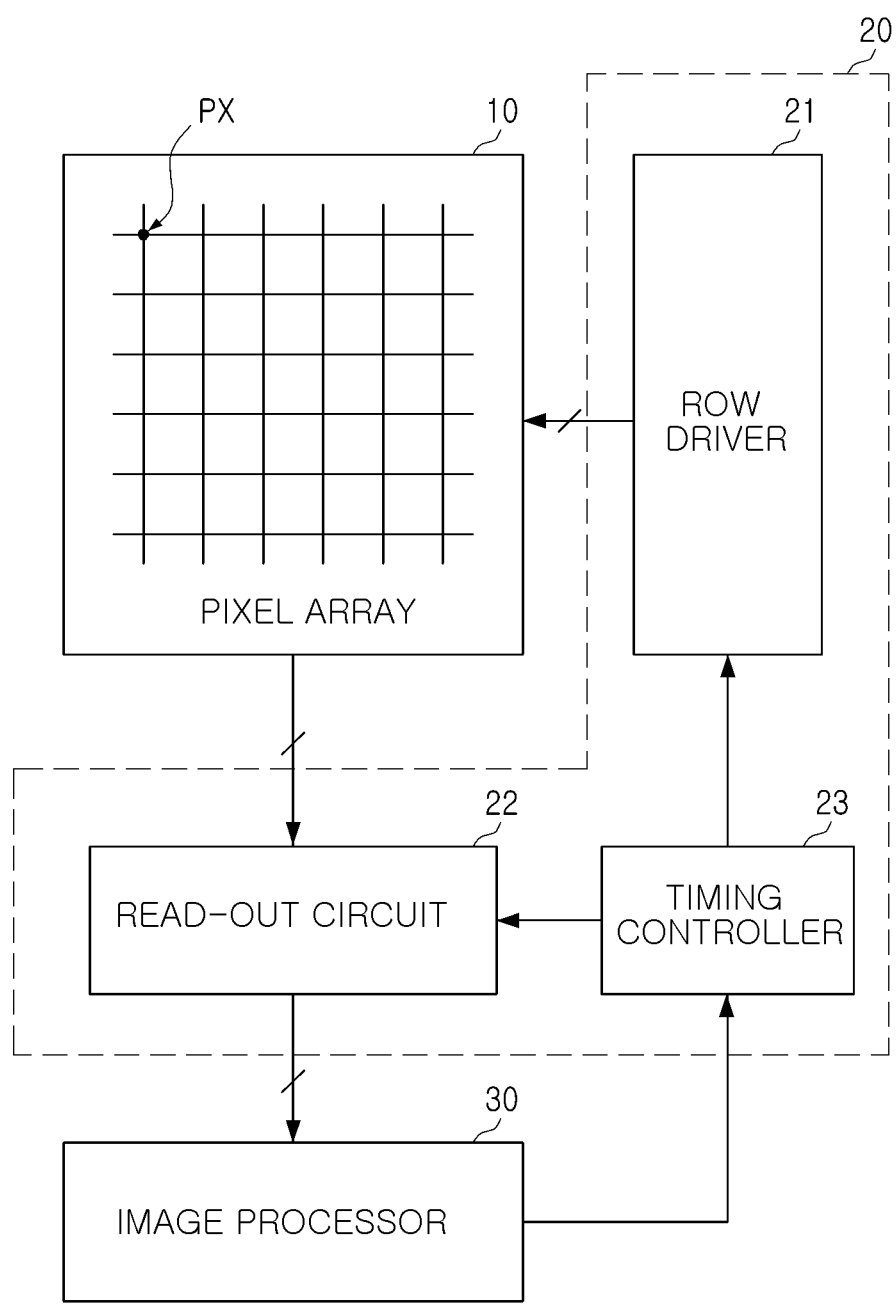
FIG. 1 is a block diagram of an image processing device according to an exemplary embodiment of the present inventive concept.

FIG. 1 is a block diagram of an image processing device according to an exemplary embodiment of the present inventive concept.

With reference to FIG. 1, an image processing device 1, according to an exemplary embodiment, includes a pixel array 10, a sensor circuit 20, and an image processor 30.

The pixel array 10 includes a plurality of pixels PX arranged along a plurality of row lines and a plurality of column lines. Each of the plurality of pixels PX includes a photoelectric device, such as a photodiode PD, receiving light and generating an electric charge from the received light. In an exemplary embodiment of the inventive concept, each of the plurality of pixels PX includes two or more photoelectric devices. In an embodiment, the two or more photoelectric devices included in a single pixel PX receive light having different colors and generate an electric charge from the received light. The two or more photoelectric devices included in the single pixel PX may be alternately stacked.

In an exemplary embodiment, each of the plurality of pixels PX includes a pixel circuit for generating a pixel voltage from an electric charge generated by a photoelectric device. In an exemplary embodiment, the pixel circuit includes a plurality of transistors. In an embodiment where a single pixel PX includes two or more photoelectric devices, each pixel PX includes two or more pixel circuits, in order to process an electric charge generated in each of the two or more photoelectric devices. In an exemplary embodiment where a first photoelectric device and a second photoelectric device are alternately stacked in a single pixel PX, the pixel circuit includes a first pixel circuit connected to the first photoelectric device and a second pixel circuit connected to the second photoelectric device. The first pixel circuit generates a first pixel voltage and the second pixel circuit generates a second pixel voltage. The first pixel circuit and the second pixel circuit may be implemented to be circuits having different structures.

In an embodiment, the sensor circuit 20 includes a row driver 21, a read-out circuit 22, and a timing controller 23. The sensor circuit 20 may control the pixel array 10 according to a command transmitted by the image processor 30. The row driver 21 may drive the plurality of pixels PX in row line units of the pixel array 10, according to a command input by the timing controller 23. In an exemplary embodiment, at least one row line is selected from among row lines included in the pixel array 10 by the row driver 21. The read-out circuit 22 is configured to detect a pixel voltage and a reset voltage from pixels PX connected to the at least one row line selected by the row driver 21, and generate image data. In an exemplary embodiment, an amount of time required for the row driver 21 to drive a single row line of the pixel array 10 is defined as a horizontal period. In an embodiment, the total time required for the row driver 21 to drive all the rows of the pixel array 10 is defined as a frame period. Thus, in an embodiment in which the number of row lines is m (m is a natural number of 2 or more), a single frame period includes m horizontal periods.

In an embodiment, the read-out circuit 22 includes a sampling circuit for detecting the pixel voltage and the reset voltage, as well as an analog-to-digital converter (ADC) for converting the detected voltages into digital values. In an embodiment, the sampling circuit includes a correlated double sampler (CDS). The CDS may detect the pixel voltage and the reset voltage from the pixels PX connected to a row line selected by the row driver 21.

The timing controller 23 may be operated by a command input by the image processor 30. The image processor 30 may control the row driver 21 and the read-out circuit 22 using the timing controller 23. In addition, the image processor 30 may generate an image based on image data output by the read-out circuit 22, and output the image to a display device, or store the image in a storage device, such as a memory device.

Figure 2:
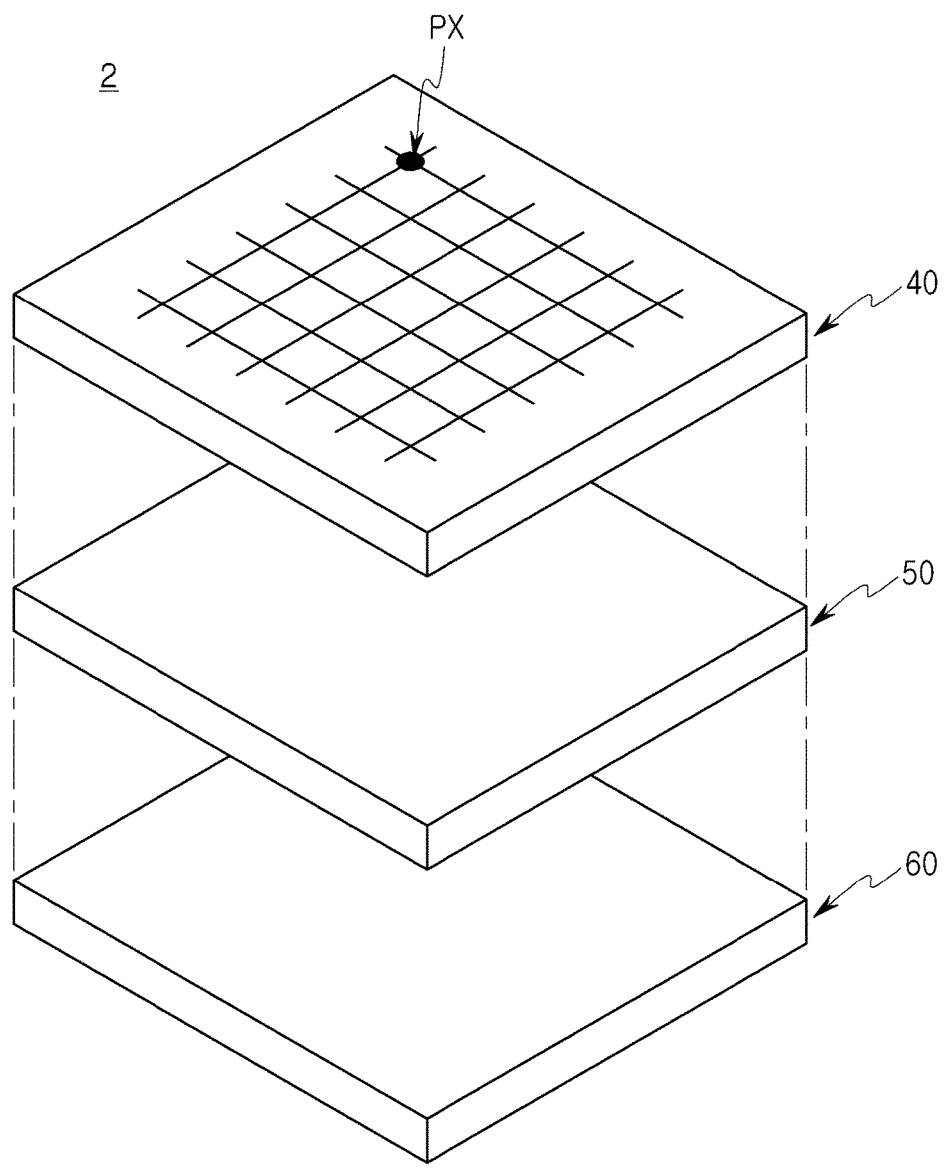
FIG. 2 is a perspective view of an image sensor according to an exemplary embodiment of the present inventive concept.

FIG. 2 is a perspective view of an image sensor according to an exemplary embodiment of the inventive concept.

With reference to FIG. 2, an image sensor 2, according to an exemplary embodiment of the inventive concept includes a pixel array 40, an integrated circuit chip 50, and a memory 60.

The pixel array 40 includes a plurality of pixels PX. The plurality of pixels PX may be arranged in a plurality of row lines and a plurality of column lines. In an embodiment, the integrated circuit chip 50 includes the row driver 21, the read-out circuit 22, the timing controller 23, and the image processor 30 as illustrated in FIG. 1.

In an exemplary embodiment, the memory 60 is provided as a single semiconductor package with the integrated circuit chip 50. The memory 60 may be implemented as a dynamic random-access memory (DRAM) or a static random-access memory (SRAM), and may be implemented as a non-volatile memory, in an exemplary embodiment. Data required for an operation of the integrated circuit chip 50 and a reset voltage detected from pixels PX during a frame period may be stored in the memory 60. In an embodiment, the integrated circuit chip 50 detects the reset voltage from the pixels PX during a frame period, and stores the detected reset voltage in the memory 60. The reset voltage stored in the memory 60 may include a reset noise component. In an embodiment, the integrated circuit chip 50 generates image data using the pixel voltage detected from the pixels PX during a frame period and the reset voltage stored in the memory 60. Since image data is generated using the pixel voltage and the reset voltage detected during the same frame period, a true CDS may be implemented in a pixel circuit having a three-transistor (3T) structure that excludes a transfer transistor.

Figure 3:
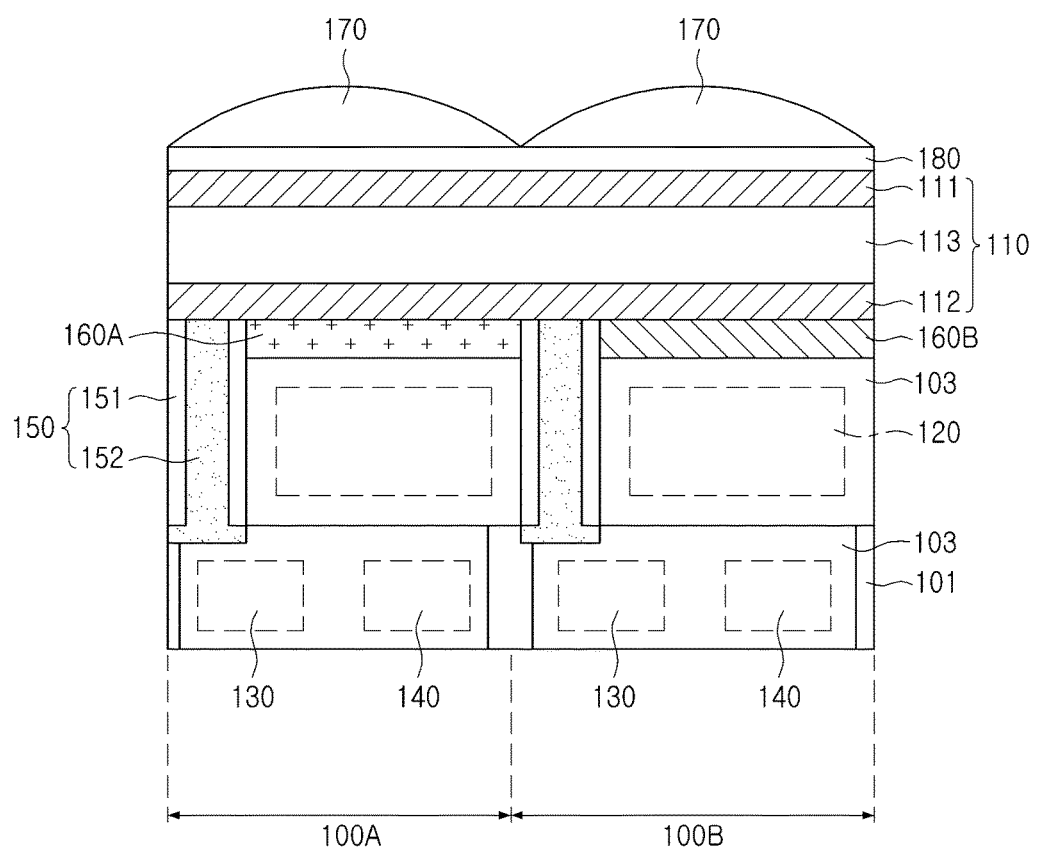
FIGS. 3 and 4 are views of a pixel included in an image sensor according to an exemplary embodiment of the present inventive concept.
Figure 4:
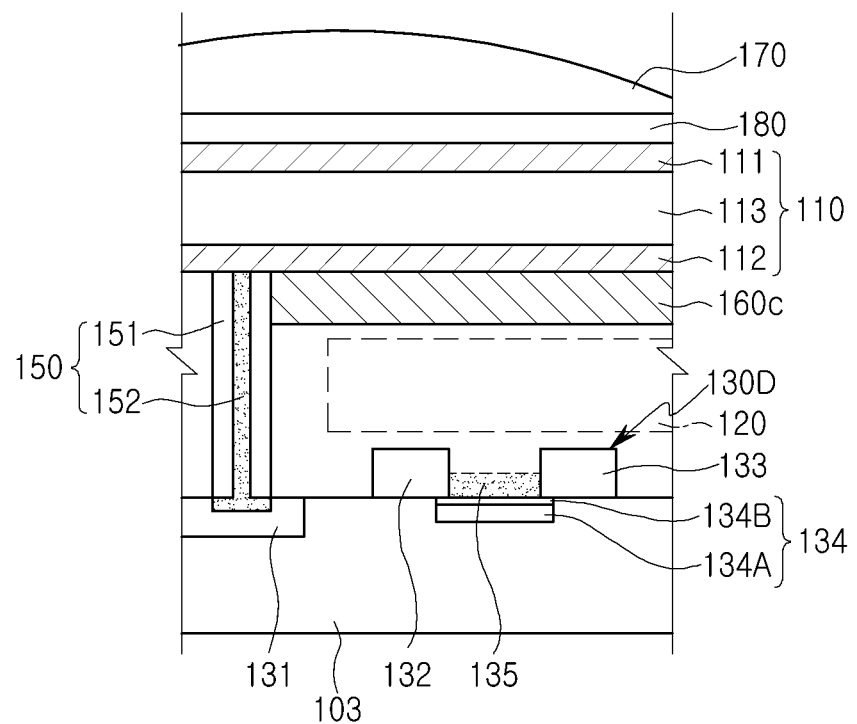

FIGS. 3 and 4 are views of a pixel included in an image sensor according to an exemplary embodiment of the inventive concept.

With reference to FIG. 3, respective pixels 100A and 100B included in the image sensor, according to an exemplary embodiment, include a first photoelectric device 110, a second photoelectric device 120, pixel circuits 130 and 140, a via 150, and a microlens 170. The first photoelectric device 110 and the second photoelectric device 120 are disposed below the microlens 170 and a protective layer 180, while the pixel circuits 130 and 140 are disposed below the first photoelectric device 110 and the second photoelectric device 120. The image sensor, according to an exemplary embodiment, is provided as a back light image sensor.

Pixels 100A and 100B may be arrayed in an m×n matrix (m and n are natural numbers of 2 or more) in a pixel array. In an embodiment, an isolation region 101 for preventing crosstalk is interposed between the pixels 100A and 100B disposed adjacently to each other. In an embodiment, light having different colors passes through a first color filter 160A and a second color filter 160B, respectively included in a first pixel 100A and a second pixel 100B, disposed adjacently to each other. In an exemplary embodiment, the first color filter 160A allows red light to pass therethrough, to be transmitted to the second photoelectric device 120, while the second color filter 160B allows blue light to pass therethrough to be transmitted to the second photoelectric device 120.

Each of the pixels 100A and 100B include the first photoelectric device 110 and the second photoelectric device 120, disposed in a stacking direction (a vertical direction in FIG. 3). The first photoelectric device 110 and the second photoelectric device 120 may receive light having different colors and may generate an electric charge from the received light. In an exemplary embodiment, the first photoelectric device 110 is an organic photodiode, and the second photoelectric device 120 is a semiconductor photodiode. The second photoelectric device 120 receives light which has passed through each of the first color filter 160A and the second color filter 160B, and may generate an electric charge carrier. A color of light passing through each of the first color filter 160A and the second color filter 160B may be different from that of the light with which the first photoelectric device 110 reacts.

In an embodiment, the first photoelectric device 110 includes an upper electrode layer 111 and a lower electrode layer 112, facing each other, and a color selection layer 113 interposed therebetween. In an embodiment, the color selection layer 113 generates an electric charge from light due to a photoelectric effect, and may include an organic material. In an embodiment, the color selection layer 113 includes a p-type layer, in which a main carrier is provided as a hole, and an n-type layer, in which a main carrier is provided as an electron. In an embodiment, the color selection layer 113 reacts with light having a specific wavelength and generates an electric charge. In an exemplary embodiment, the color selection layer 113 reacts with green light and generates an electric charge. In this case, light having any color except green is transmitted to the second photoelectric device 120 by color filters 160A and 160B. In an embodiment, the color selection layer 113 filters out green light and allows red and blue light to pass.

The upper electrode layer 111 and the lower electrode layer 112 may be formed using a transparent conductive material, such as indium tin oxide (ITO), indium zinc oxide (IZO), zinc oxide (ZnO), or tin oxide ($SnO_2$), or a translucent material, such as a metal thin film. In an exemplary embodiment, the upper electrode layer 111 has a work function higher than or equal to that of the lower electrode layer 112. In an embodiment, the work function is a minimum thermodynamic work (energy) needed to remove an electron from a solid to a point in a vacuum immediately outside the solid surface.

The first pixel circuit 130 is connected to the first photoelectric device 110, and generates a first pixel voltage from an electric charge generated by the first photoelectric device 110. The second pixel circuit 140 is connected to the second photoelectric device 120, and generates a second pixel voltage from an electric charge generated by the second photoelectric device 120.

The first pixel circuit 130 is connected to the first photoelectric device 110 by a via electrode 150. The via electrode 150 may be provided as a micro through silicon via (μTSV). In an embodiment, the via electrode 150 includes an insulating portion 151 and a conductive portion 152. In an embodiment, the conductive portion 152 extends along a side wall of a pixel (e.g., 100A or 110B), and connects the first photoelectric device 110 to the first pixel circuit 130. The insulating portion 151 may be formed using an insulating material, such as silicon dioxide ($SiO_2$), silicon nitride (SiN), aluminum oxide ($Al_2O_3$), or hafnium oxide (HfOx). In an exemplary embodiment, one surface or side of the conductive portion 152 is connected to the lower electrode layer 112 of the first photoelectric device 110. In the embodiment, the other surface or side of the conductive portion 152 is connected to a circuit device among a plurality of circuit devices included in the first pixel circuit 130. In an exemplary embodiment, the conductive portion 152 is directly connected to a floating diffusion node included in the first pixel circuit 130. Thus, an electric charge generated in the first photoelectric device 110 does not pass through a transfer transistor, and may be directly accumulated at the floating diffusion node. In other words, the first pixel circuit 130 may be provided as a pixel circuit having a 3T structure. In an embodiment, the second pixel circuit 140, connected to the second photoelectric device 120, is provided as a pixel circuit having a four-transistor (4T) structure, which includes the transfer transistor.

In a pixel circuit having the 4T structure, a reset voltage is detected first in a single frame using the transfer transistor, and the pixel voltage is then detected later. In a pixel circuit having the 3T structure without the transfer transistor, the pixel voltage and the reset voltage are detected during different frame periods. Thus, in a case where noise components generated in a reset operation are different in respective frames, if a reset noise component is not properly processed, the reset voltage and the pixel voltage may not be accurately detected. In at least one embodiment of the present inventive concept, improper processing of the reset noise component may be avoided using a frame memory or a feedback technique.

FIG. 4 is a view illustrating a region of FIG. 3. With reference to FIG. 4, a device of the first pixel circuit 130, connected to the first photoelectric device 110, is illustrated. As described above, the first pixel circuit 130 has the 3T structure. Thus, in an embodiment, a floating diffusion node 131 is directly connected to the via electrode 150, while an electric charge generated in the first photoelectric device 110 is directly accumulated in the floating diffusion node 131.

A driving transistor 130D may be operated as a source follower amplifier, and may generate the pixel voltage using an electric charge accumulated in the floating diffusion node 131.

In an exemplary embodiment, the driving transistor 130D includes source/drain regions 132 and 133, a gate electrode 134, and a lightly doped region 135. The gate electrode 134 includes an electrode layer 134A and a gate insulating layer 134B. The lightly doped region 135 is formed between the source/drain regions 132 and 133, thereby implementing the driving transistor 130D as a native transistor having a threshold voltage close to 0V.

The floating diffusion node 131 may be formed in such a manner that an n-type impurity is injected into a well region 103 doped with a p-type impurity. Thus, a pn junction may be formed between the floating diffusion node 131 and the well region 103. As an electric potential of the floating diffusion node 131 is increased, a level of a leakage current may be increased in a direction opposite the pn junction. In order to reduce the level of a leakage current, the reset voltage of the first pixel circuit 130 may be set to be relatively low, and a depletion-mode transistor may be used as the driving transistor 130D. In this case, however, characteristics of the depletion-mode transistor, which is relatively vulnerable to low-frequency noise, may be problematic.

In an exemplary embodiment, the native transistor may be used as the driving transistor 130D, in order to solve the problem described above. Since, in terms of the native transistor, a channel region between the source/drain regions 132 and 133 is implemented as the lightly doped region 135, a noise problem caused by random dopant fluctuation may be solved. Since the native transistor is provided as a transistor without a threshold voltage, a driving transistor may be operated, even at a relatively low reset voltage.

Figure 5A:
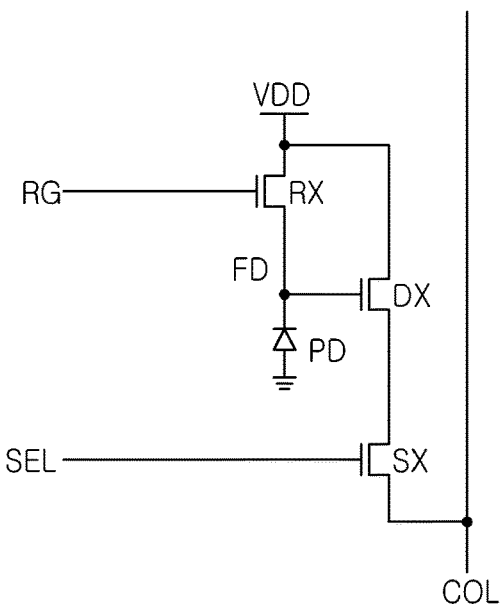
FIGS. 5A and 5B are circuit diagrams of a pixel circuit included in an image sensor according to an exemplary embodiment of the present inventive concept.
Figure 5B:
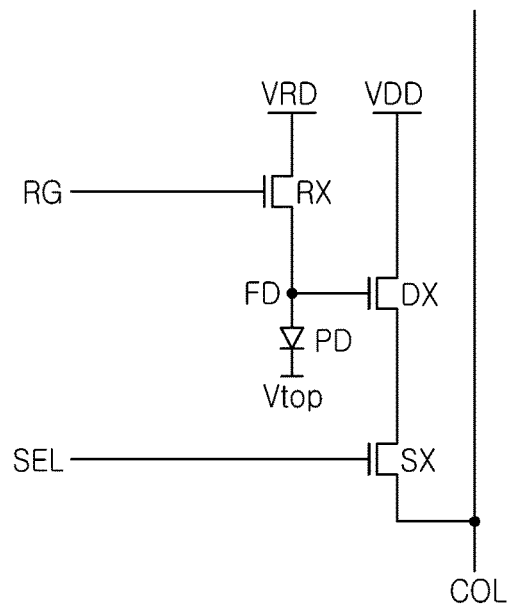

FIGS. 5A and 5B are circuit diagrams of a pixel circuit included in an image sensor according to an exemplary embodiment of the inventive concept. The pixel circuit, according to the exemplary embodiment illustrated in FIGS. 5A and 5B, may be employed as a first pixel circuit 130, connected to a first photoelectric device 110 in the exemplary embodiment illustrated in FIGS. 3 and 4.

The pixel circuit, according to the exemplary embodiment illustrated in FIGS. 5A and 5B, includes a reset transistor RX, a driving transistor DX, a selection transistor SX. The floating diffusion node FD is directly connected to a photoelectric device PD. A gate terminal of the driving transistor DX is connected to the floating diffusion node FD. An electric charge generated in the photoelectric device PD may be accumulated in the floating diffusion node FD. In an exemplary embodiment, the photoelectric device PD is connected to the floating diffusion FD by a micro through silicon via, and may be provided as an organic photodiode, including an organic material.

The driving transistor DX may be operated as a source follower buffer amplifier using an electric charge accumulated in the floating diffusion node FD. In an embodiment, the selection transistor SX is operated by a selection control signal SEL, input by a row driver (e.g., 21), and performs switching and addressing operations. In an embodiment, when the selection control signal SEL is input from the row driver and the selection transistor SX is turned on, a pixel voltage or a reset voltage is output to a column line COL connected to the selection transistor SX. The pixel voltage or the reset voltage may be detected by a sampling circuit included in a read-out circuit (e.g., 22).

The reset transistor RX is operated by a reset control signal RG, which is input by the row driver. The reset transistor RX may reset a voltage of the floating diffusion node FD by the reset control signal RG. In each of the exemplary embodiments illustrated in FIGS. 5A and 5B, drain terminals of the reset transistor RX are connected to different reset voltages, due to a difference in polarities of electric charges generated in the photoelectric device PD.

In the exemplary embodiment illustrated in FIG. 5A, the photoelectric device PD uses an electron as a main charge carrier. Since the electron is used as the main charge carrier, an anode (e.g., of a photoelectric diode) is connected to a node receiving a ground voltage in the photoelectric device PD, while a cathode (e.g., of the photoelectric diode) is connected to the floating diffusion node FD. In an embodiment, the drain terminal of the reset transistor RX is connected to a node receiving a power source voltage VDD, along with the drain terminal of the driving transistor DX. In an embodiment, the power source voltage VDD is higher than the ground voltage.

In the exemplary embodiment illustrated in FIG. 5B, the photoelectric device PD uses the hole as the main charge carrier. In a case where the hole is used as the main charge carrier, the anode of the photoelectric device PD is connected to the floating diffusion node FD, while the cathode of the photoelectric device PD is connected to a node receiving an upper electrode voltage Vtop. In an exemplary embodiment, the upper electrode voltage Vtop has a level of a few volts, such as about 3.0 V. Since the hole is generated as the main charge carrier in the photoelectric device PD, the drain terminal of the reset transistor RX is connected to a node receiving a read voltage VRD, having a value different from that of the power source voltage VDD. The pixel circuit may be implemented to use the hole as the main charge carrier, thereby improving dark current characteristics.

Figure 6:
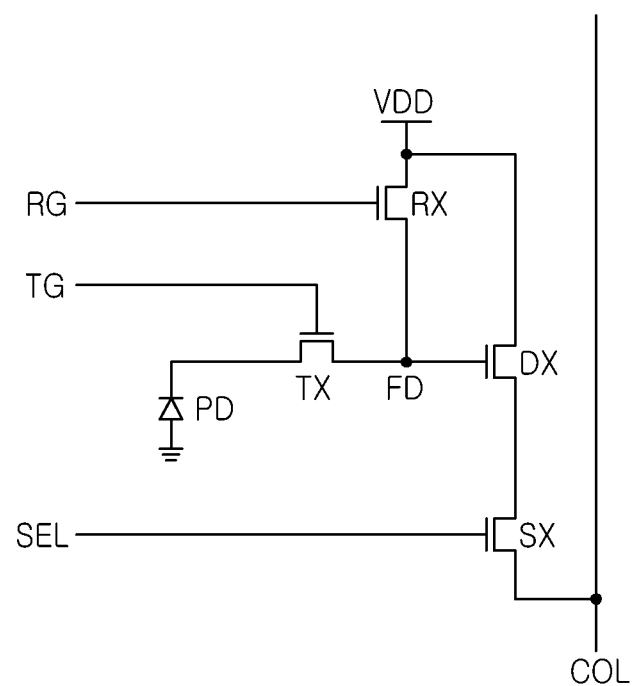
FIG. 6 is a circuit diagram of a pixel circuit included in an image sensor according to an exemplary embodiment of the present inventive concept.

FIG. 6 is a circuit diagram of a pixel circuit included in an image sensor according to an exemplary embodiment of the inventive concept. The pixel circuit illustrated in FIG. 6 may be employed as the second pixel circuit 140, connected to the second photoelectric device 120 in the exemplary embodiment illustrated in FIGS. 3 and 4.

With reference to FIG. 6, the pixel circuit further includes a transfer transistor TX, in addition to a reset transistor RX, a driving transistor DX, and a selection transistor SX. The photoelectric device PD connected to the pixel circuit may be provided as a semiconductor photodiode, and is connected to a floating diffusion node FD by the transfer transistor TX. In other words, in a manner different from the exemplary embodiment illustrated in FIG. 5A or FIG. 5B, a cathode or an anode of the photoelectric device PD is not directly connected to the floating diffusion node FD.

In an embodiment, the transfer transistor TX transmits an electric charge accumulated in the photoelectric device PD to the floating diffusion node FD in response to a transfer control signal TG transmitted from a row driver. The photoelectric device PD may use an electron as a main carrier. Operations of the reset transistor RX, the driving transistor DX, and the selection transistor SX may be similar to that described above with reference to FIGS. 5A and 5B. A pixel voltage or a reset voltage may be output by a column line COL connected to the selection transistor SX. The pixel voltage or the reset voltage may be detected by a read-out circuit.

Figure 7:
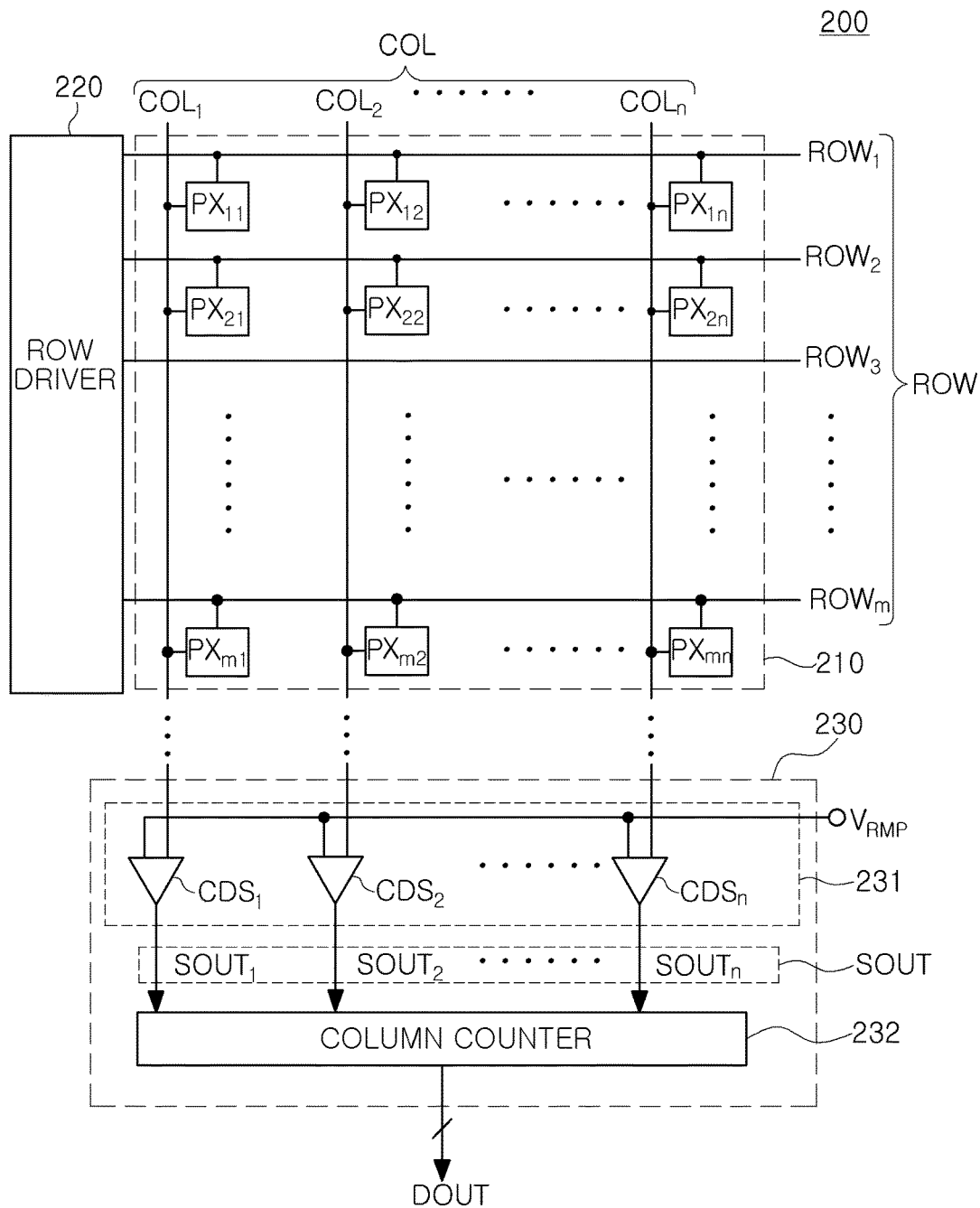
FIG. 7 is a schematic view of an image sensor according to an exemplary embodiment of the present inventive concept.

FIG. 7 is a schematic view of an image sensor according to an exemplary embodiment of the inventive concept.

With reference to FIG. 7, an image sensor 200, according to an exemplary embodiment, includes a pixel array 210, a row driver 220, and a read-out circuit 230. The row driver 220 may input a reset control signal or a selection control signal to each pixel circuit by row lines ROW. The read-out circuit 230 may detect a pixel voltage and a reset voltage from pixels PX connected to the row lines ROW selected by the row driver 220, and may perform an analog-to-digital conversion operation. In an embodiment, the read-out circuit 230 includes a sampling circuit 231 including a plurality of CDSs ($CDS_1$ to $CDS_n$) and a column counter 232 converting an output SOUT of the sampling circuit 231 into a digital value. The output SOUT includes a plurality of outputs $SOUT_1, SOUT_2, \ldots,$ and SOUL. Each CDS in the sampling circuit 231 may receive a ramp voltage $V_{RMP}$ and an output from a corresponding one of the column lines COL (e.g., $COL_1, COL_2, \ldots, COL_n$).

The pixel array 210 may include a plurality of row lines ROW that extend in a direction, and column lines COL intersecting the row lines ROW. The row lines ROW and the column lines COL may be connected to pixels $PX_{11}$ to $PX_{mn}$, while each of the pixels $PX_{11}$ to $PX_{mn}$ may include at least one photoelectric device and at least one pixel circuit. In an exemplary embodiment, each of the pixels $PX_{11}$ to $PX_{mn}$, includes at least one pixel circuit in which a floating diffusion FD node is directly connected to a photoelectric device PD without a transfer transistor TX, as illustrated in the exemplary embodiment of FIG. 5A or FIG. 5B.

As described above, in the pixel circuit, according to the exemplary embodiment illustrated in FIG. 5A or FIG. 5B, an electric charge generated in the photoelectric device PD may be directly accumulated in the floating diffusion node FD. Thus, the pixel voltage is not detected after the reset voltage is first detected in a single frame. In the exemplary embodiment illustrated in FIG. 5A or FIG. 5B, after the pixel voltage is first detected, and an electric potential of the floating diffusion FD is reset in the following frame, and the reset voltage is detected, thereby performing a CDS. In this case, since a reset noise component in a frame in which the pixel voltage is detected is different from a reset noise component in a frame in which the reset voltage is detected, the reset noise component is not removed significantly by the CDS.

The image sensor 200, according to an exemplary embodiment, may adopt various methods for effectively removing a noise component generated in the pixel circuit in which the floating diffusion FD is directly connected to the photoelectric device PD.

Figure 8:
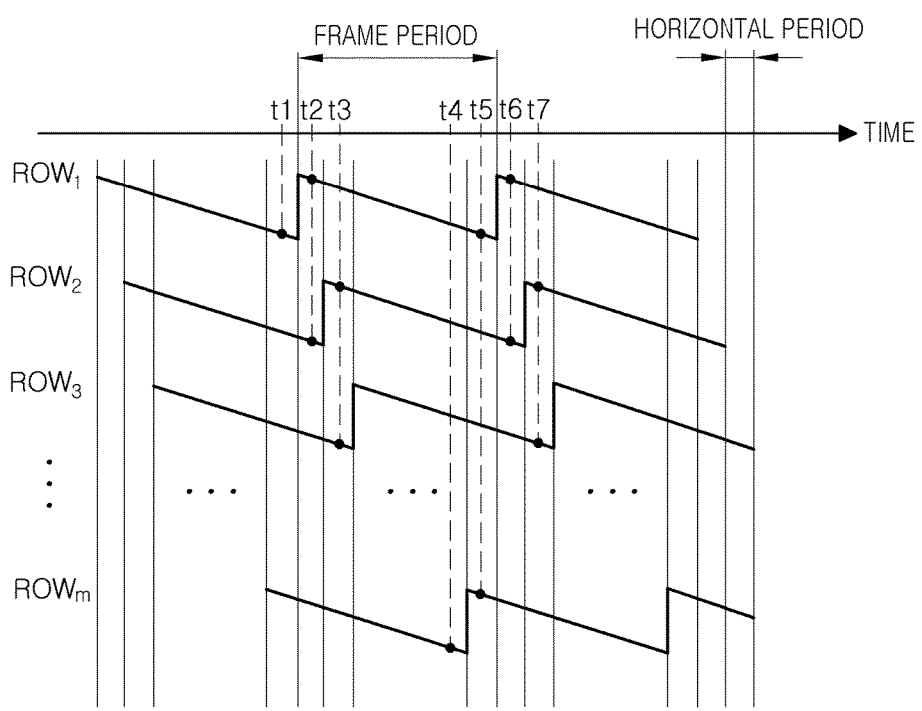
FIGS. 8, 9A, and 9B are views illustrating an operation of an image sensor according to an exemplary embodiment of the present inventive concept.

FIGS. 8 and 9 are views illustrating an operation of an image sensor according to an exemplary embodiment of the inventive concept.

First, with reference to FIG. 7 and FIG. 8, pixels $PX_{11}$ to $PX_{mn}$, connected to each of row lines ROW during a frame period, are selected. The frame period of the pixels $PX_{11}$ to $PX_{mn}$ connected to each of different row lines ROW may have a specific time difference. In an embodiment, the frame period of second pixels $PX_{21}$-$PX_{2n}$ connected to a second row line $ROW_2$ is started after a certain delay time has elapsed, since the frame period of first pixels $PX_{11}$-$PX_{1n}$ connected to a first row line $ROW_1$ is started. In an embodiment, the delay time is equal to a horizontal period for scanning one of the row lines.

In a case where a pixel circuit, according to the exemplary embodiment illustrated in FIG. 6, is included in each of the pixels $PX_{11}$ to $PX_{mn}$, the row driver 220 controls a transfer transistor TX, and determines whether or not to move an electrical charge generated in a photoelectric device PD to a floating diffusion node FD. Thus, after an electric potential of the floating diffusion node FD is reset within a single horizontal period, so that a read-out circuit 230 detects a reset voltage, the transfer transistor TX is turned on, and the pixel voltage is detected.

As a result, in the pixel circuit, according to the exemplary embodiment illustrated in FIG. 6, a noise component introduced into the reset voltage may be directly reflected in the pixel voltage. Thus, consistency between the reset voltage and the pixel voltage is guaranteed, so that the noise component may be removed significantly in a process of performing a CDS. In a case where the pixel circuit, according to the exemplary embodiment illustrated in FIG. 5A or 5B, is included in each of the pixels $PX_{11}$ to $PX_{mn}$, the pixel voltage and the reset voltage may be sequentially detected at times belonging to different frame periods, because the floating diffusion node FD and the photoelectric device PD are directly connected without a transfer transistor TX connected therebetween.

In an embodiment, with reference to FIG. 8, the read-out circuit 230 first detects the pixel voltage of the first pixels $PX_{11}$ to $PX_{1n}$ at time t1, detects the reset voltage of the first pixels $PX_{11}$ to $PX_{1n}$ at time t2 belonging to a frame period different from the time t1, thereby performing the CDS. Thus, a different reset noise component may be introduced during each frame period, so that a reset noise component included in the pixel voltage detected at time t1 is not effectively removed.

In an exemplary embodiment, the problem described above may be solved using various methods. With reference to the exemplary embodiment illustrated in FIGS. 9A and 9B, a problem in which a noise component is not removed from a pixel circuit including a floating diffusion node FD and a photoelectric device PD, directly connected to each other, is solved using a feedback technique.

Figure 9A:
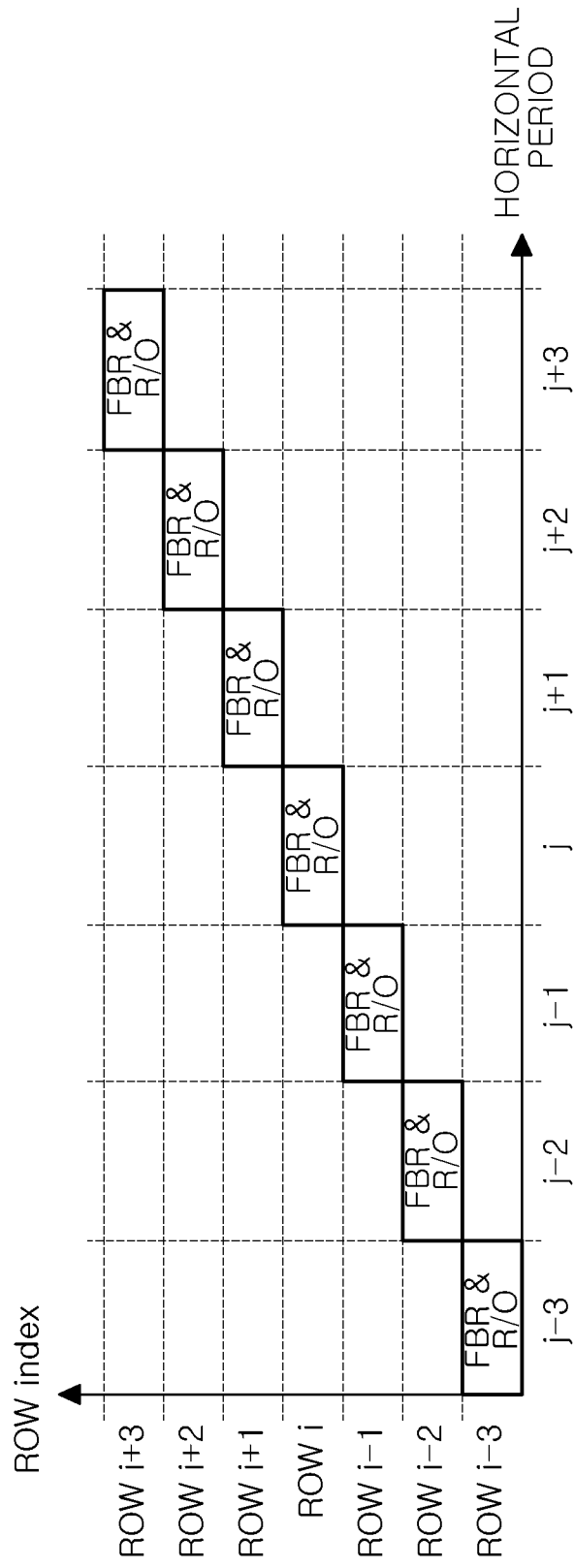

First, FIG. 9A is a view describing a method of detecting a reset voltage and a pixel voltage according to a general method. With reference to FIG. 9A, pixels connected to a single row line are operated in a feedback reset (FBR) mode and in a readout (R/O) mode during an arbitrary horizontal period. In other words, within a single horizontal period, each of the pixels connected to a specific row line is operated in the FBR mode for stabilizing the reset voltage, and in the R/O mode, which outputs the pixel voltage and the reset voltage. Thus, a sufficient operating time of each of the FBR mode and the RIO mode may be difficult to secure.

Figure 9B:
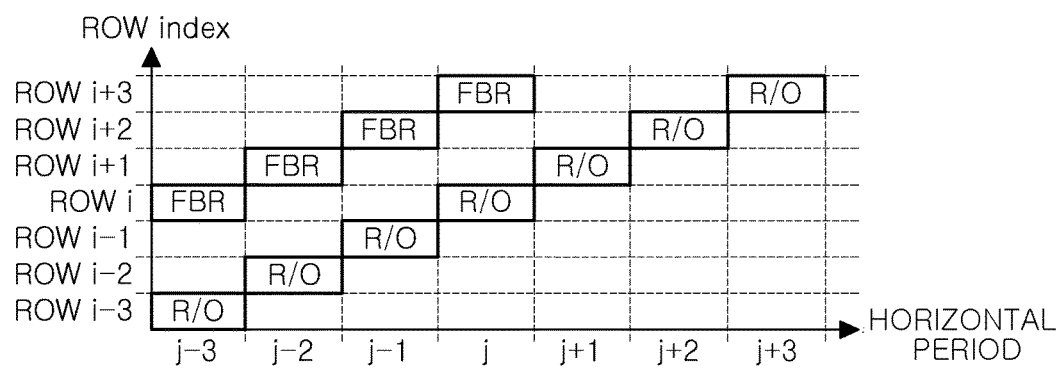

In the exemplary embodiment illustrated in FIG. 9B, the problem described above may be solved in such a manner that the FBR mode and the R/O mode are separated. For example, rather than pixels of a given row line being operated in both the FBR mode and the R/O mode during a single horizontal period, the pixels of the given row line are only operated in the FBR mode or the R/O during the single horizontal period. With reference to FIG. 9B, during an arbitrary horizontal period, pixels connected to the first row line are operated in the FBR mode. Pixels connected to a second row line, different from the first row line during the same arbitrary horizontal period, are operated in the R/O mode, which outputs the pixel voltage and the reset voltage. In other words, the pixels connected to a single row line are operated in the FBR mode during a first horizontal period. In a case where a second horizontal period follows the first horizontal period, the pixels are operated in the R/O mode.

In a case where an electric charge accumulation time (a shutter time) is taken as being three horizontal periods, in the exemplary embodiment illustrated in FIG. 9B, pixels connected to the [i]th row line $ROW_i$ are operated in the FBR mode during a [j−3]th horizontal period. During the same [j−3]th horizontal period, pixels connected to an [i−3]th row line $ROW_{i-3}$ are operated in the R/O mode. The pixels connected to the [i]th row line $ROW_i$ are operated in the R/O mode during a [j]th horizontal period occurring after the [j−3]th horizontal period. In other words, the pixels connected to the [i]th row line $ROW_i$ are operated in the FBR mode in advance during the [j−3]th horizontal period, thereby performing a shutter operation and removing a noise component included in the reset voltage. Subsequently, when the [j]th horizontal period occurs, the pixels connected to the [i]th row line $ROW_i$ are operated in the R/O mode, and output the pixel voltage and the reset voltage. Thus, an operating time in the FBR mode may be sufficiently secured, thereby effectively removing the noise component included in the reset voltage. A time for detecting the pixel voltage and the reset voltage in the R/O mode may be sufficiently secured, thereby implementing a high-speed read-out operation.

In the exemplary embodiment illustrated in FIG. 9B, an interval between the first horizontal period, operated in the FBR mode, and the second horizontal period, operated in the R/O mode in each of the pixels is determined according to an intensity of light incident on the image sensor. In an exemplary embodiment, in a case where the intensity of light is relatively high, the interval between the first horizontal period and the second horizontal period may be reduced. In a case where the intensity of light incident on the image sensor is increased, compared to the exemplary embodiment illustrated in FIG. 9B, while the pixels connected to the [i]th row line $ROW_i$ are operated in the FBR mode, pixels connected to an [i−1]th row line $ROW_{i-1}$ are operated in the RIO mode.

Figure 10:
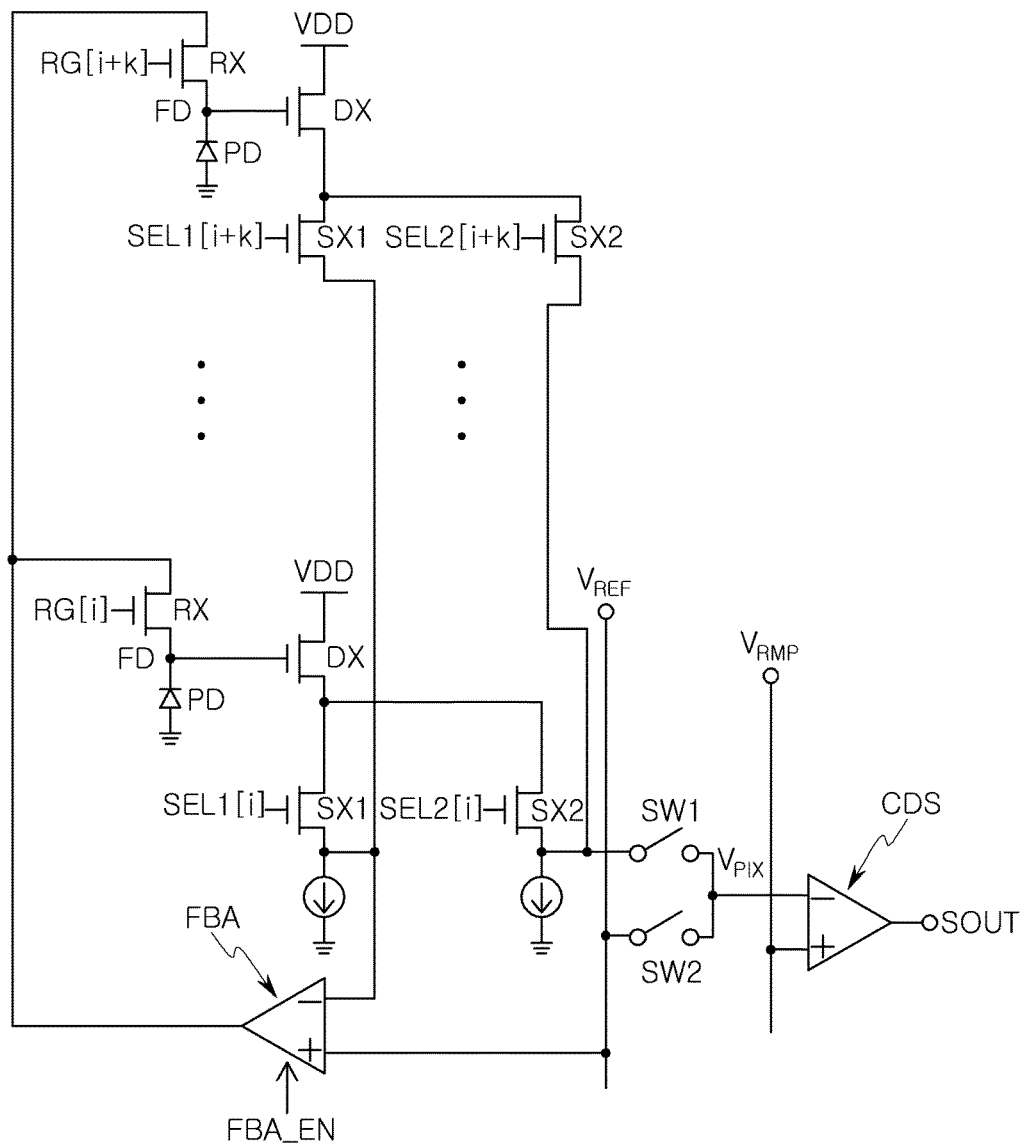
FIGS. 10, 11A, and 11B are views illustrating an operation of a pixel circuit included in an image sensor according to an exemplary embodiment of the present inventive concept.
Figure 11A:
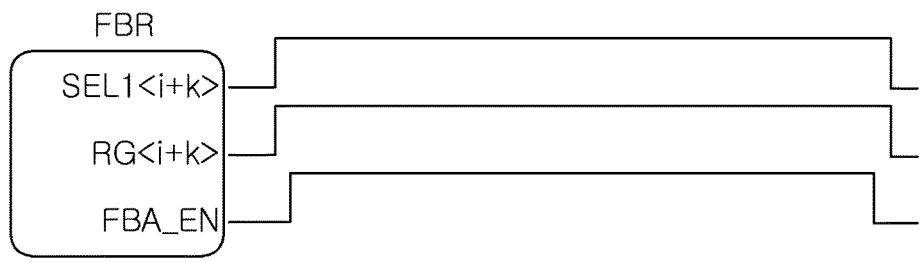
Figure 11B:
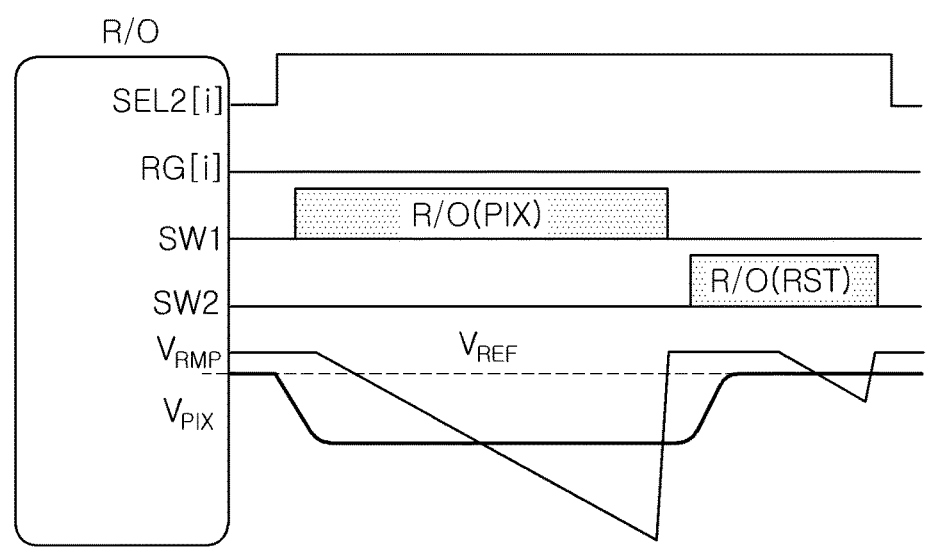

FIGS. 10, 11A, and 11B are views illustrating an operation of a pixel circuit included in an image sensor according to an exemplary embodiment of the inventive concept.

With reference to FIG. 10, in the image sensor, according to an exemplary embodiment, a pixel circuit includes a floating diffusion node FD directly connected to a photoelectric device PD, a reset transistor RX, a driving transistor DX, a first selection transistor SX1, and a second selection transistor SX2. In other words, in the image sensor, according to the exemplary embodiment, a pixel circuit includes a plurality of selection transistors SX1 and SX2. In the exemplary embodiment of the image sensor illustrated in FIG. 10, a pixel circuit connected to an [i]th row line and a pixel circuit connected to an [i+k]th row line are operated by different control signals input by a row driver.

A first selection transistor SX1 and a second selection transistor SX2 are controlled by a first selection control signal SEL1 and a second selection control signal SEL2, respectively, and are connected to a feedback device FBA and a sampling circuit CDS. In an embodiment, the feedback device FBA is or includes at least one operational amplifier. An output terminal of the first selection transistor SX1 is connected to an inverting terminal of the operational amplifier included in the feedback device FBA. The output terminal of the second selection transistor SX2 may be connected to the inverting terminal of the sampling circuit CDS by a first switch SW1. In an exemplary embodiment, while a pixel is operated in the FBR mode, the first selection transistor SX1 is turned on, and the second selection transistor SX2 is turned off. In the embodiment, while the pixel is operated in the RIO mode, the first selection transistor SX1 is turned off, and the second selection transistor SX2 is turned on.

A reference voltage $V_{REF}$ is input to a non-inverting terminal of the operational amplifier included in the feedback device FBA, and the output terminal of the feedback device FBA is connected to a drain terminal of the reset transistor RX. In an exemplary embodiment, while the feedback device FBA is activated and the first selection transistor SX1 and the reset transistor RX are turned on, a feedback loop is formed by a drain terminal of the reset transistor RX, thereby fixing a node voltage of a floating diffusion node FD. Thus, while the pixel is operated in the FBR mode, a reset voltage of the pixel is set to be the reference voltage $V_{REF}$ by the feedback device FBA. In addition, the FBR mode and the RIO mode are implemented in different sampling periods, thereby sufficiently securing an operating time of the feedback device FBA. Thus, a reset noise component generated during a reset operation may be effectively removed.

FIG. 11A is a timing diagram showing an example in which a pixel connected to the [i+k]th row line $ROW_{i+k}$ is operated in the FBR mode, as in the exemplary embodiment illustrated in FIG. 10. FIG. 11B is a timing diagram showing an example in which a pixel connected to the [i]th row line $ROW_i$ is operated in the RIO mode, as in the exemplary embodiment illustrated in FIG. 10. In the exemplary embodiment illustrated in FIGS. 11A and 11B, in a case where a shutter time is taken as being k times the horizontal period, the pixels connected to the [i+k]th row line $ROW_{i+k}$ are operated in the FBR mode and the pixels connected to the [i]th row line $ROW_i$ are operated in the RIO mode, during a single sampling period.

In an embodiment, first, with reference to FIG. 11A, in order to operate the pixels connected to the [i+k]th row line $ROW_{i+k}$ in the FBR mode, the first selection transistor SX1, the reset transistor RX, and the feedback device FBA are turned on. The feedback device FBA may be turned on by applying a feedback enable signal FBA_EN. The second selection transistor SX2 included in each of the pixels connected to the [i+k]th row line $ROW_{i+k}$ are turned off.

While the feedback device FBA is operated in the FBR mode, the feedback device FBA inputs a feedback voltage for setting a pixel output as the reference voltage $V_{REF}$ into the drain terminal of the reset transistor RX. Since, in an exemplary embodiment, the FBR mode is separated from the RIO mode, sufficient time may be secured to operate in the FBR mode. In the FBR mode, the reset transistor RX is turned on. Thus, an electric potential of the floating diffusion node FD is reset as a value made by adding a threshold voltage of a driving transistor to the reference voltage $V_{REF}$, and the pixel output is fixed to be the reference voltage $V_{REF}$, thereby removing a reset noise component.

While the pixels connected to the [i+k]th row line $ROW_{i+k}$ are operated in the FBR mode during a single sampling period, the pixels connected to the [i]th row line $ROW_i$ are operated in the R/O mode during the same single sampling period. With reference to FIG. 11B, in order to operate the pixels connected to the [i]th row line $ROW_i$ in the R/O mode, the second selection transistor SX2 is turned on, and the reset transistor RX and the first selection transistor SX1 is turned off. In an embodiment, in each of the pixels operated in the RIO mode, the first switch SW1 and a second switch SW2 are alternately turned on in a single sampling period. In FIG. 11B, the first switch SW1 is illustrated as being turned on first, but the order may be reversed.

In each of the pixels operated in the R/O mode, the electric potential of the floating diffusion node FD is changed by an electric charge generated in the photoelectric device PD. In a circuit, according to the exemplary embodiment illustrated in FIG. 10, the photoelectric device PD uses an electron as a main charge carrier. Thus, as illustrated in FIG. 11B, a pixel voltage $V_{PIX}$ has a value lower than that of the reference voltage $V_{REF}$, or the reset voltage. A difference in electric charges between the reference voltage $V_{REF}$ and the pixel voltage $V_{PIX}$ may be proportional to an amount of an electric charge formed in the photoelectric device PD, that is, to an intensity of light incident on the image sensor.

The sampling circuit CDS may generate an analog output SOUT by comparing a ramp voltage $V_{RMP}$ and the pixel voltage $V_{PIX}$, changed to have a predetermined slope. An output terminal of the sampling circuit CDS may be connected to a column counter. The column counter may count the number of clocks in a section in which a level of the ramp voltage $V_{RMP}$ is greater than a level of the pixel voltage $V_{PIX}$, thereby converting the analog output SOUT into digital data.

In a case where readout of the pixel voltage $V_{PIX}$ has completed, the first switch SW1 is turned off, and the second switch SW2 is turned on, so that the reference voltage $V_{REF}$ is input into the inverting terminal of the sampling circuit CDS. Each of the pixels is first operated in the FBR mode, and then operated in the RIO mode. Thus, the reference voltage $V_{REF}$ is equal to the reset voltage output, in a case where the reset transistor RX resets the electric potential of the floating diffusion FD. The sampling circuit CDS may generate the analog output SOUT by comparing the ramp voltage $V_{RMP}$ and the reference voltage $V_{REF}$. The column counter may count the number of clocks in a section in which a level of the ramp voltage $V_{RMP}$ is greater than a level of the reference voltage $V_{REF}$, thereby converting the analog output SOUT into digital data.

Figure 12:
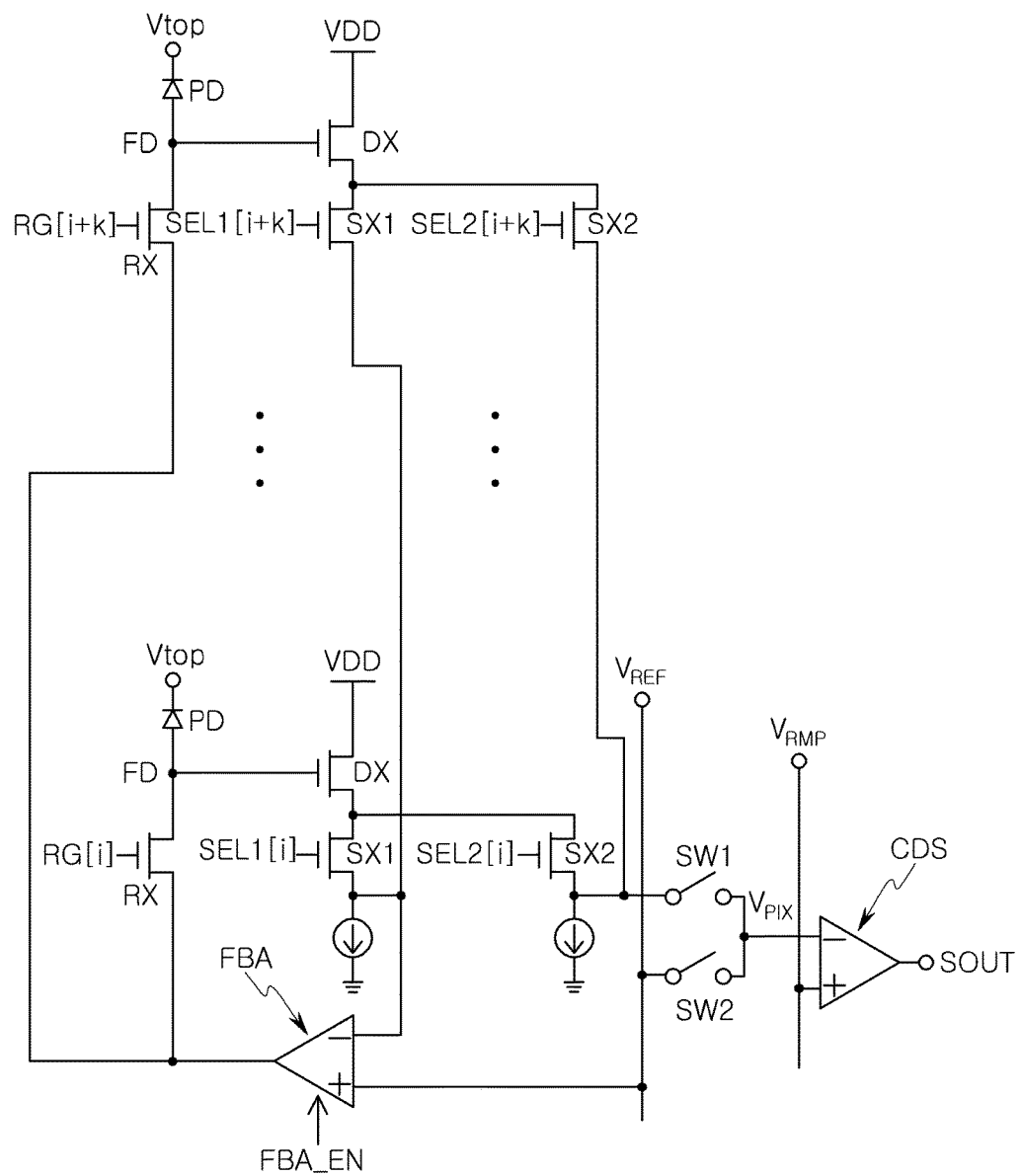
FIGS. 12, 13A, and 13B are views illustrating an operation of a pixel circuit included in an image sensor according to an exemplary embodiment of the present inventive concept.
Figure 13A:
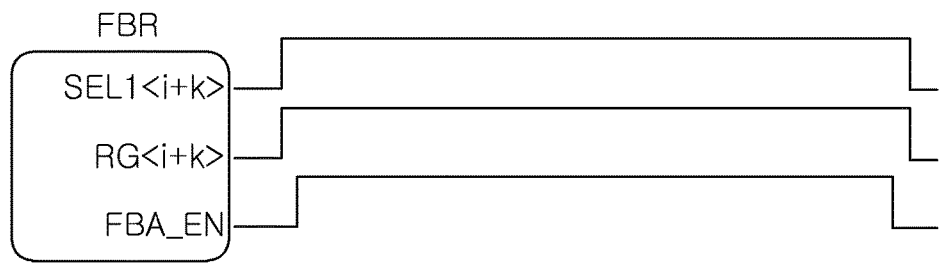
Figure 13B:
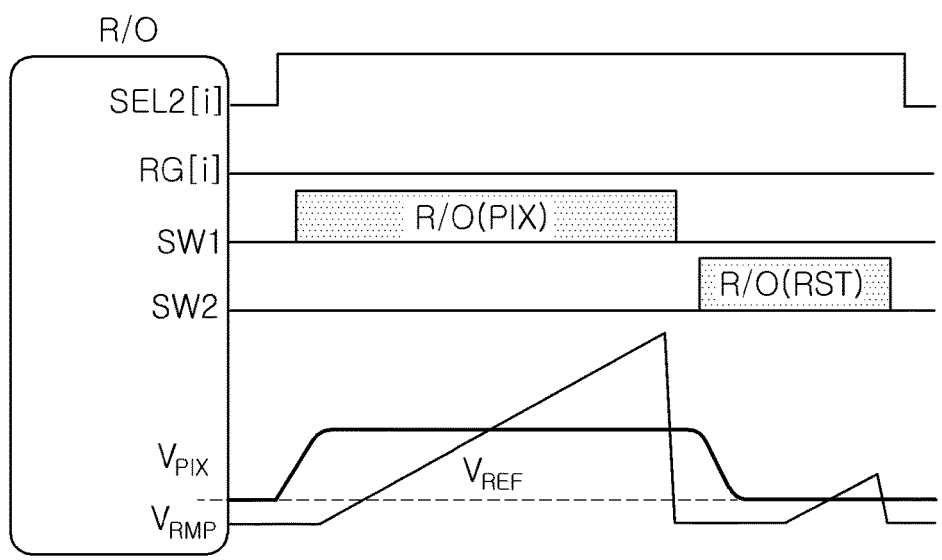

FIGS. 12, 13A, and 13B are views illustrating an operation of a pixel circuit included in an image sensor according to an exemplary embodiment of the inventive concept.

With reference to FIG. 12, in an image sensor according to an exemplary embodiment, the pixel circuit includes a floating diffusion node FD directly connected to a photoelectric device PD, a reset transistor RX, a driving transistor DX, a first selection transistor SX1, and a second selection transistor SX2. In a manner different from the exemplary embodiment illustrated in FIG. 10, an anode of the photoelectric device PD is connected to the floating diffusion FD, and a main charge carrier generated by the photoelectric device PD is provided as a hole.

With reference to FIGS. 13A and 13B, pixels connected to an [i+k]th row line $ROW_{i+k}$ are operated in an FBR mode during a single sampling period, while pixels connected to an [i]th row line $ROW_i$ are operated in an RIO mode. In the FBR mode, the reset transistor RX and the first selection transistor SX1 are turned on. Thus, an electric potential of the floating diffusion FD is reset as a value made by adding a threshold voltage of a driving transistor to a reference voltage $V_{REF}$, and a pixel output is fixed to be the reference voltage $V_{REF}$.

In the R/O mode, the second selection transistor SX2 is turned on, while the reset transistor RX and the first selection transistor SX1 are turned off. The photoelectric device PD accumulates a hole generated by light in the floating diffusion FD. Thus, a level of the pixel voltage $V_{PIX}$ is higher than a level of the reference voltage $V_{REF}$, as illustrated in FIG. 13B. A difference between the pixel voltage $V_{PIX}$ and the reference voltage $V_{REF}$ may be determined according to an intensity of light incident on the image sensor. While a first switch SW1 is turned on, a sampling circuit CDS generates an analog output SOUT by comparing a ramp voltage $V_{RMP}$ and the pixel voltage $V_{PIX}$. In a case where the first switch SW1 is turned off, and the second switch SW2 is turned on, the reference voltage $V_{REF}$ is input to an inverting terminal of the sampling circuit CDS, while the sampling circuit CDS generates the analog output SOUT by comparing the reference voltage $V_{REF}$ and the ramp voltage $V_{RMP}$.

Figure 14A:
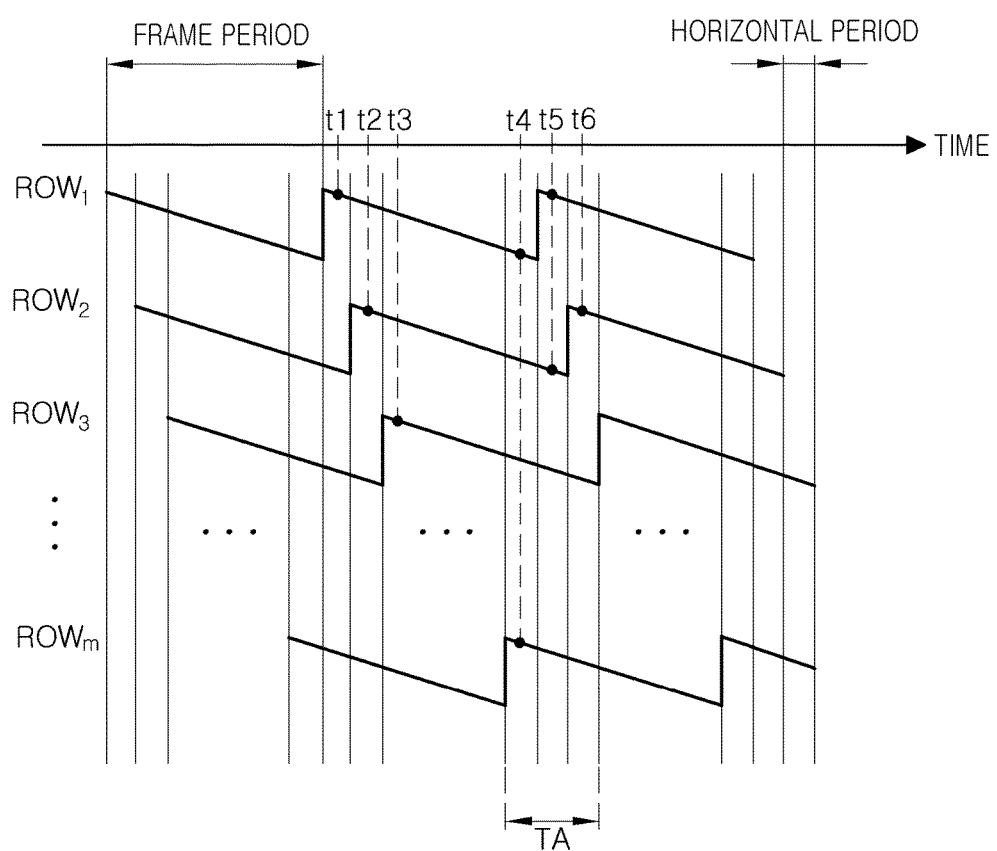
FIGS. 14A and 14B are views illustrating an operation of an image sensor according to an exemplary embodiment of the inventive concept.
Figure 14B:
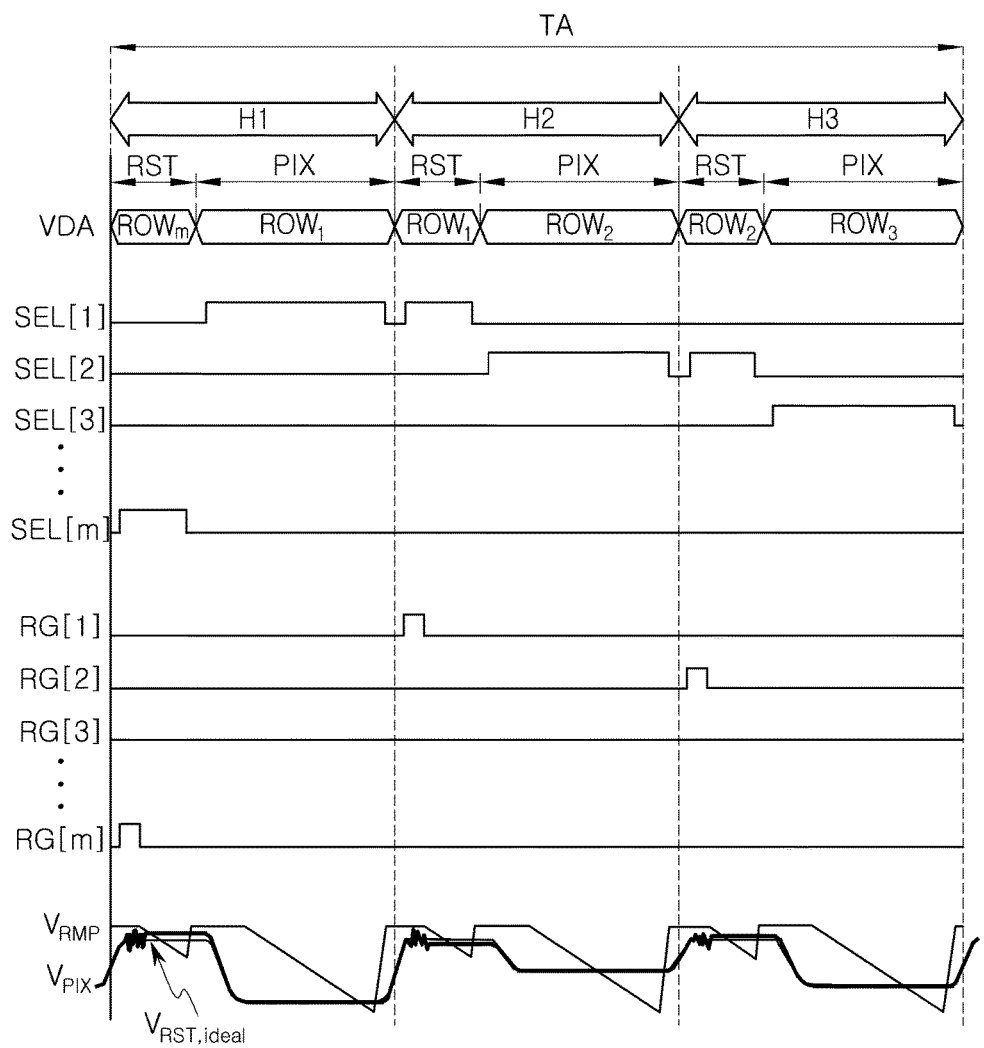

FIGS. 14A and 14B are views illustrating an operation of an image sensor according to an exemplary embodiment of the inventive concept.

The image sensor, according to the exemplary embodiment described with reference to FIGS. 14A and 14B, includes at least one frame memory. The frame memory may classify and store a reset voltage during a frame period of each pixel included in a pixel array, according to a row line. The reset voltage stored in the frame memory may be used to implement a true CDS.

With reference to FIG. 14A, a single frame period includes a plurality of horizontal periods. Each of the plurality of horizontal periods corresponds to a time for detecting a pixel voltage or the reset voltage from the pixels connected to a single row line. Thus, in a case where the pixel array includes m row lines, a single frame period includes m horizontal periods. A frame period of each of the row lines may have a difference (e.g., an offset) corresponding to a single horizontal period. In an embodiment, the frame period of the second row line $ROW_2$ is started later, by a single horizontal period, than the frame period of the first row line $ROW_1$.

With reference to FIG. 14A, the reset voltage of each of first pixels connected to the first row line $ROW_1$ is detected at a time t1 and stored in the frame memory. The reset voltage of each of second pixels connected to the second row line $ROW_2$ is detected at time t2 and stored in the frame memory. At time t4, the reset voltage of each of mth pixels connected to an mth row line $ROW_m$ is detected and stored in the frame memory, while the pixel voltage of each of the first pixels connected to the first row line $ROW_i$ may be detected simultaneously.

The image sensor calculates a difference between the pixel voltage and the reset voltage detected in each of the first pixels during a single frame period in such a manner that a difference between the pixel voltage detected at time t4 from the first pixels, and the reset voltage of the first pixels detected at time t1 and stored in the frame memory is calculated. The image sensor may include an arithmetic circuit (e.g., a subtractor) for calculating the difference. Thus, since a reset noise component generated during a reset operation is equally reflected in the reset voltage and the pixel voltage, a true CDS may be implemented without separately removing the reset noise component.

With reference to FIG. 14B, an enlarged view of a time interval TA in FIG. 14A, three horizontal periods H1 to H3 are illustrated. Each of the horizontal periods H1 to H3 includes a first sampling section RST for detecting the reset voltage, and a second sampling section PIX for detecting the pixel voltage.

With reference to a first horizontal period H1, a floating diffusion node included in each of the mth pixels connected to the mth row line $ROW_m$ in the first sampling section RST are reset, while a sampling circuit detects the reset voltage of each of the mth pixels. In an embodiment, a level of the reset voltage of each of the mth pixels is higher than that of an ideal reset voltage $V_{RST,ideal}$ due to a positive (+) noise component. The reset voltage detected by the sampling circuit may be converted into a digital value by an analog-to-digital converter, and may be stored in the frame memory. In the second sampling section PIX, the pixel voltage is detected from each of the first pixels connected to the first row line $ROW_1$. The pixel voltage detected in the first pixels may be converted into a digital value by the analog-to-digital converter.

The image sensor calculates a difference between the pixel voltage detected in the first pixels and the reset voltage of the first pixels stored in the frame memory. The reset voltage of the first pixels stored in the frame memory may be provided as a value detected at time t1 and stored in the frame memory. Thus, the image sensor may calculate a difference between the reset voltage and the pixel voltage detected in a single frame period. Since the reset noise component generated during the reset operation is equally reflected in the reset voltage and the pixel voltage, the true CDS may be implemented. The difference between the reset voltage and the pixel voltage may be calculated in a digital domain.

In the first sampling section RST of a second horizontal period H2, the reset voltage of the first pixels connected to the first row line ROW$_1$ is detected. In an embodiment, the level of the reset voltage of the first pixels detected in the second horizontal period H2 is lower than that of the ideal reset voltage V$_{RST,ideal}$ due to a negative (−) noise component. The reset voltage of the first pixels detected in the second horizontal period H2 may be stored in the frame memory. In other words, the reset voltage of the first pixels previously stored in the frame memory is updated to be the reset voltage of the first pixels detected in the second horizontal period H2.

Figure 15A:
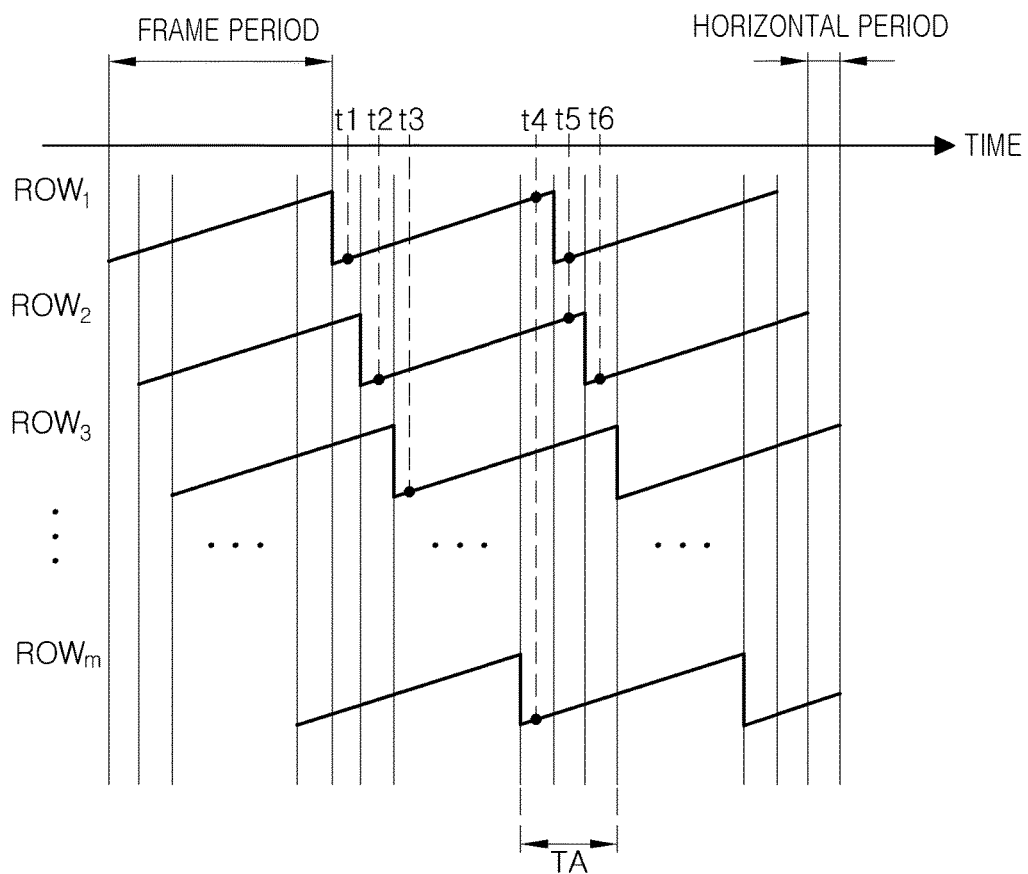
FIGS. 15A and 15B are views illustrating an operation of an image sensor according to an exemplary embodiment of the inventive concept.
Figure 15B:
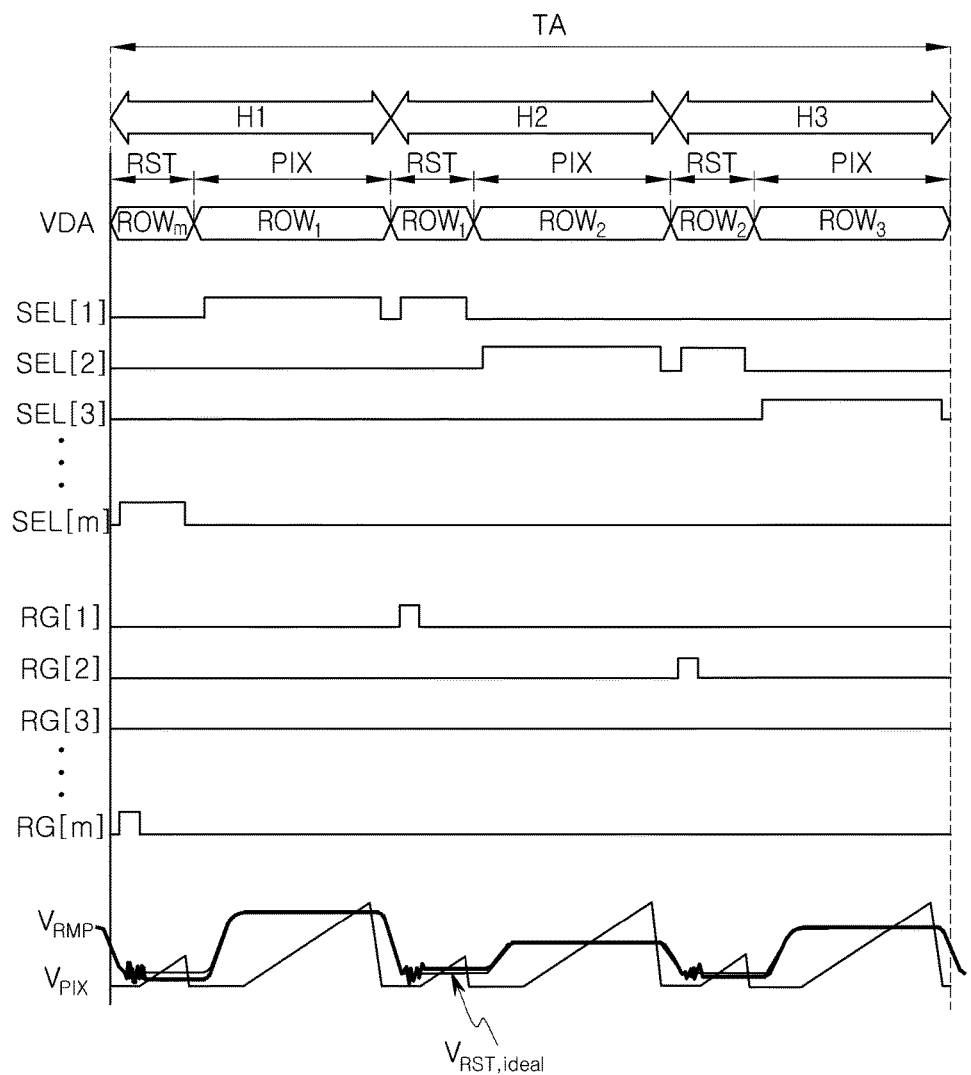

FIGS. 15A and 15B are views illustrating an operation of an image sensor according to an exemplary embodiment of the inventive concept.

An operation of the image sensor, according to the exemplary embodiment illustrated in FIGS. 15A and 15B, is similar to that of the image sensor, according to the exemplary embodiment illustrated in FIGS. 14A and 14B. However, a hole is used as a main charge carrier in FIGS. 15A and 15B. Thus, a level of a pixel voltage V$_{PIX}$ or the ramp voltage V$_{RMP}$ may be increased or decreased, in a direction opposite that of the exemplary embodiment illustrated in FIGS. 14A and 14B.

Figure 16:
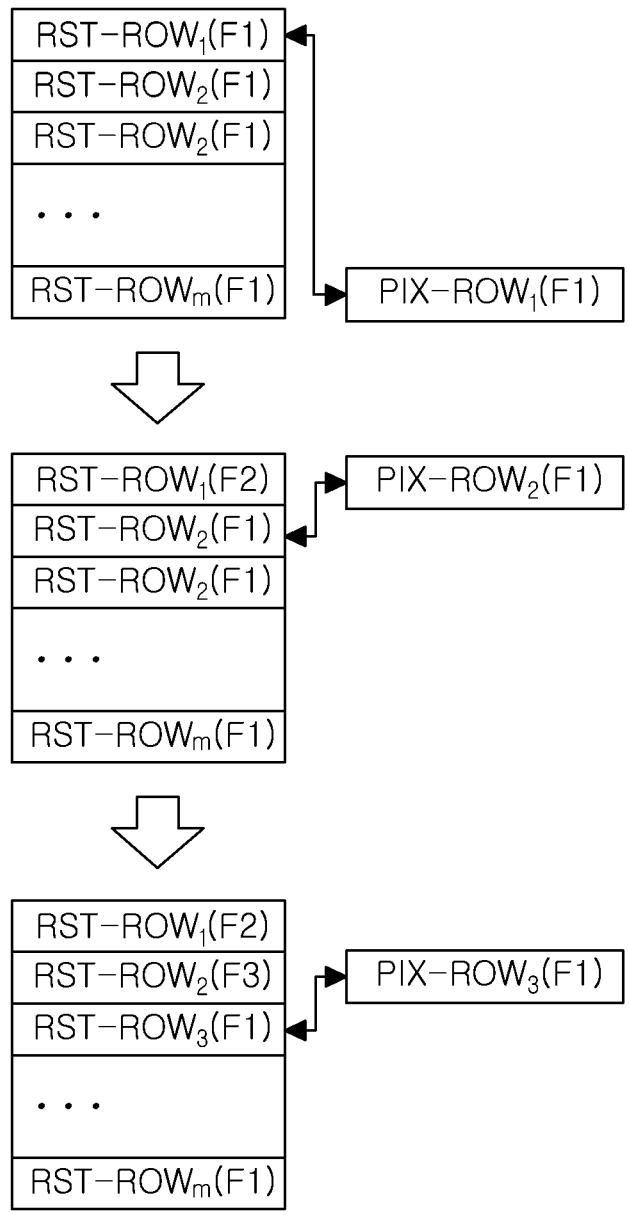
FIG. 16 is a view illustrating a frame memory included in an image sensor according to an exemplary embodiment of the present inventive concept.

FIG. 16 is a view illustrating a frame memory included in an image sensor according to an exemplary embodiment of the inventive concept.

With reference to FIG. 16, the frame memory stores a reset voltage of respective pixels according to row lines. A size of the frame memory may vary depending on the number of pixels included in a pixel array.

The image sensor detects a pixel voltage PIX-ROW$_1$ (F1) from the first pixels connected to a first row line ROW$_1$ during a first frame period F1. The image sensor calculates a difference between the pixel voltage PIX-ROW$_1$ (F1) and a reset voltage RST-ROW$_1$ (F1) stored in the frame memory FM, in a digital domain. An entirety of the pixel voltage PIX-ROW$_1$ (F1) and the reset voltage RST-ROW$_1$ (F1) is a voltage detected from the first pixels during the first frame period F1 of the first row line ROW$_1$. Thus, the pixel voltage PIX-ROW$_1$ (F1) and the reset voltage RST-ROW$_1$ (F1) may include the same reset noise component, which may be removed by a CDS.

When the CDS for the first pixels connected to the first row line ROW$_1$ has completed, the image sensor performs the CDS for second pixels connected to a second row line ROW$_2$. With reference to FIG. 16, a difference between a pixel voltage PIX-ROW$_2$ (F1) detected from the second pixels and a reset voltage RST-ROW$_2$ (F1) stored in the frame memory may be calculated in the digital domain. In a same manner as the first pixels, an entirety of the pixel voltage PIX-ROW$_2$ (F1) and the reset voltage RST-ROW$_2$ (F1) may be provided as a voltage detected from the second pixels during the first frame period F1 of the second row line ROW$_2$. Thus, the reset noise component may be removed by the CDS.

Before the pixel voltage PIX-ROW$_2$ (F1) detected from the second pixels is detected, the reset voltage RST-ROW$_1$ (F2) of each of the first pixels is detected in a second frame period F2. The reset voltage RST-ROW$_1$ (F2) may be stored in the frame memory. Thus, the reset voltage RST-ROW$_1$ (F1) of each of the first pixels previously stored may be updated.

When the CDS for the second pixels connected to the second row line ROW$_2$ has completed, the image sensor performs the CDS for third pixels, connected to a third row line ROW$_3$. In other words, the image sensor calculates a difference between a pixel voltage PIX-ROW$_3$ (F1) of each of the third pixels and a reset voltage RST-ROW$_3$ (F1) stored in the frame memory in the digital domain. In addition, the image sensor may detect the reset voltage RST-ROW$_2$ (F2) of each of the second pixels entering the second frame period F2 to store in the frame memory, thus updating the reset voltage RST-ROW$_2$ (F1) of each of the second pixels previously stored. By applying the operation described above to all row lines, the difference between the pixel voltage and the reset voltage detected in a single frame period may be calculated, and the reset noise component may be removed.

FIGS. 17 to 20 are views illustrating an operation of a pixel circuit included in an image sensor according to an exemplary embodiment of the inventive concept.

Figure 17:
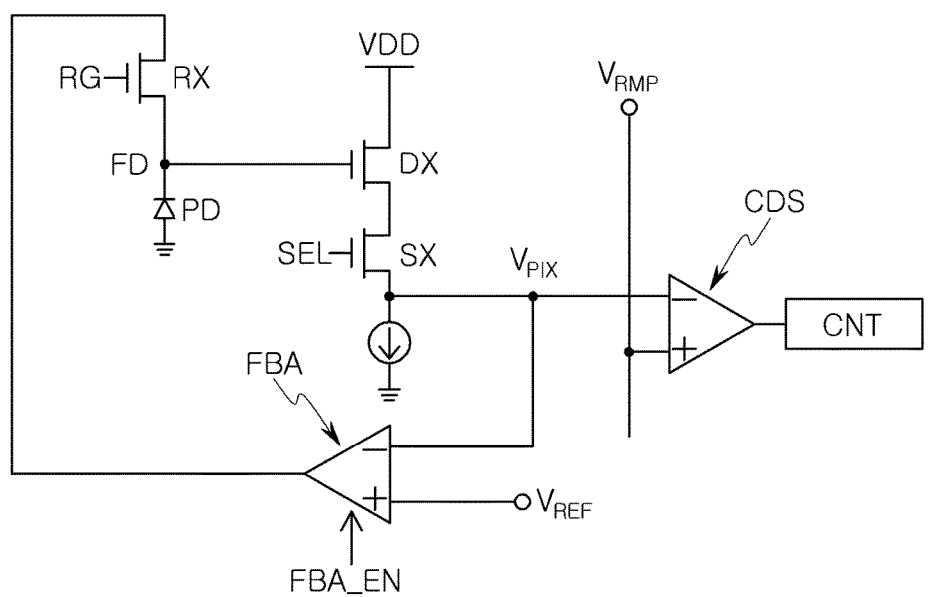
FIGS. 17 to 20 are views illustrating an operation of a pixel circuit included in an image sensor according to an exemplary embodiment of the present inventive concept.

First, with reference to FIG. 17, in the image sensor, according to an exemplary embodiment, a pixel circuit includes a floating diffusion node FD connected to a photoelectric device PD, a reset transistor RX, a driving transistor DX, and a selection transistor SX. The reset transistor RX is configured to reset an electric potential of the floating diffusion node FD to a reset voltage, in response to a reset control signal RG. In the exemplary embodiment illustrated in FIG. 17, the reset voltage is determined by a feedback device FBA.

In an embodiment, the feedback device FBA includes an operational amplifier receiving a reference voltage V$_{REF}$ at a non-inverting terminal and a pixel voltage V$_{PIX}$ at an inverting terminal. A reset noise component included in the reset voltage in a reset operation may be reduced by the feedback device FBA. Output of a sampling circuit CDS detecting the reset voltage may be input to a counter CNT. In an embodiment, the counter CNT compares the reset voltage with a ramp voltage V$_{RMP}$ and counts a clock signal, thus converting the reset voltage into a digital value and storing the digital value in a frame memory. Hereinafter, a description will be provided with reference to FIG. 18.

Figure 18:
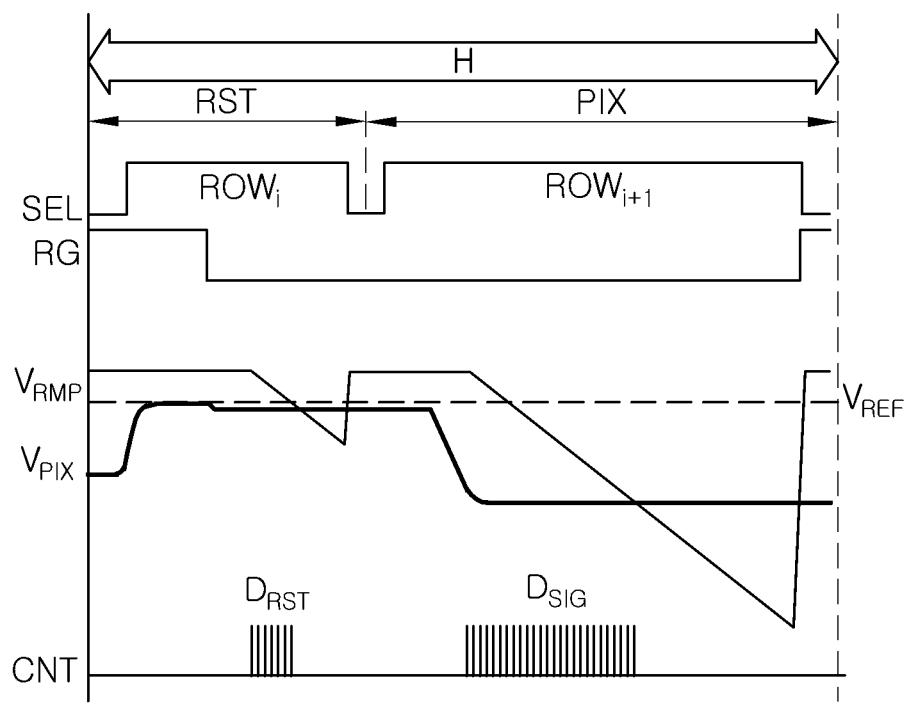

With reference to FIG. 18, a single horizontal period H includes a first sampling section RST for detecting the reset voltage of the pixels connected to an [i]th row line ROW$_i$ and a second sampling section PIX for detecting the pixel voltage of the pixels connected to an [i+1]th row line ROW$_{i+1}$. In the exemplary embodiment illustrated in FIG. 18, a level of the reset voltage is lower than that of the reference voltage V$_{REF}$, due to a negative (−) reset noise component. However, a magnitude of the reset noise component reflected in the reset voltage may be reduced by the feedback device FBA. Thus, a time D$_{RST}$ required for the counter CNT to convert the reset voltage into a digital value may be reduced. Since in the exemplary embodiment illustrated in FIG. 17, a capacitor for removing a DC component is omitted, an effect of increasing a degree of integration in a circuit may be obtained.

Figure 19:
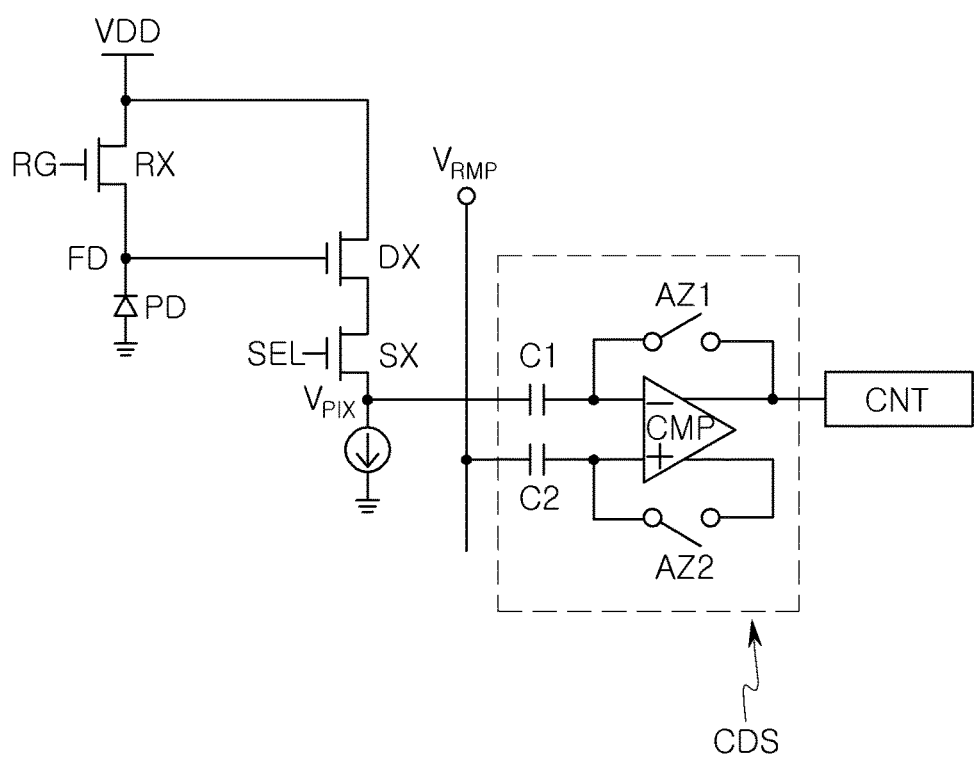

With reference to FIG. 19, in the image sensor, according to an exemplary embodiment, the sampling circuit CDS connected with the pixel circuit includes capacitors C1 and C2 for removing the DC component, auto-zero switches AZ1 and AZ2, and a comparator CMP. With reference to the timing diagram illustrated in FIG. 20, the reset control signal RG and an auto-zero signal AZ are activated during the first sampling section RST for detecting the reset voltage. When the auto-zero signal AZ is activated, a first auto-zero switch AZ1 and a second auto-zero switch AZ2 are turned on.

Figure 20:
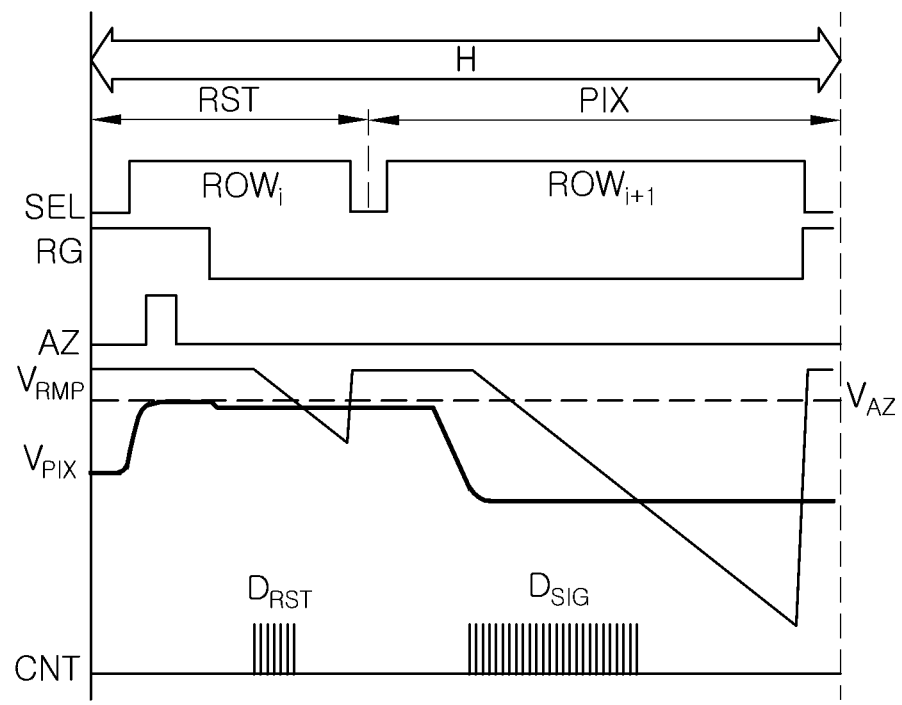

In the exemplary embodiment illustrated in FIGS. 19 and 20, the DC component of the reset voltage input to the comparator CMP is removed by capacitors C1 and C2, while the reset transistor RX is turned off later than the auto-zero switches AZ1 and AZ2. Thus, the reset noise component generated during the reset operation may be stored in the frame memory while being reflected in the reset voltage. In the exemplary embodiment illustrated in FIG. 20, the reset voltage having the negative (−) reset noise component is stored in the frame memory.

In an exemplary embodiment, the reset voltage is stored in the frame memory with the reset noise component. However, dispersion of the reset voltage may be reduced using the feedback device FBA and the auto-zero switches AZ1 and AZ2, thus reducing the time $D_{RST}$ required for the counter CNT to convert the reset voltage into a digital value. Since the reset noise component is reflected in the pixel voltage to be subsequently detected, as well as in the reset voltage, the reset noise component may be removed by calculating the difference between the pixel voltage and the reset voltage. Thus, a true CDS may be implemented.

Figure 21:
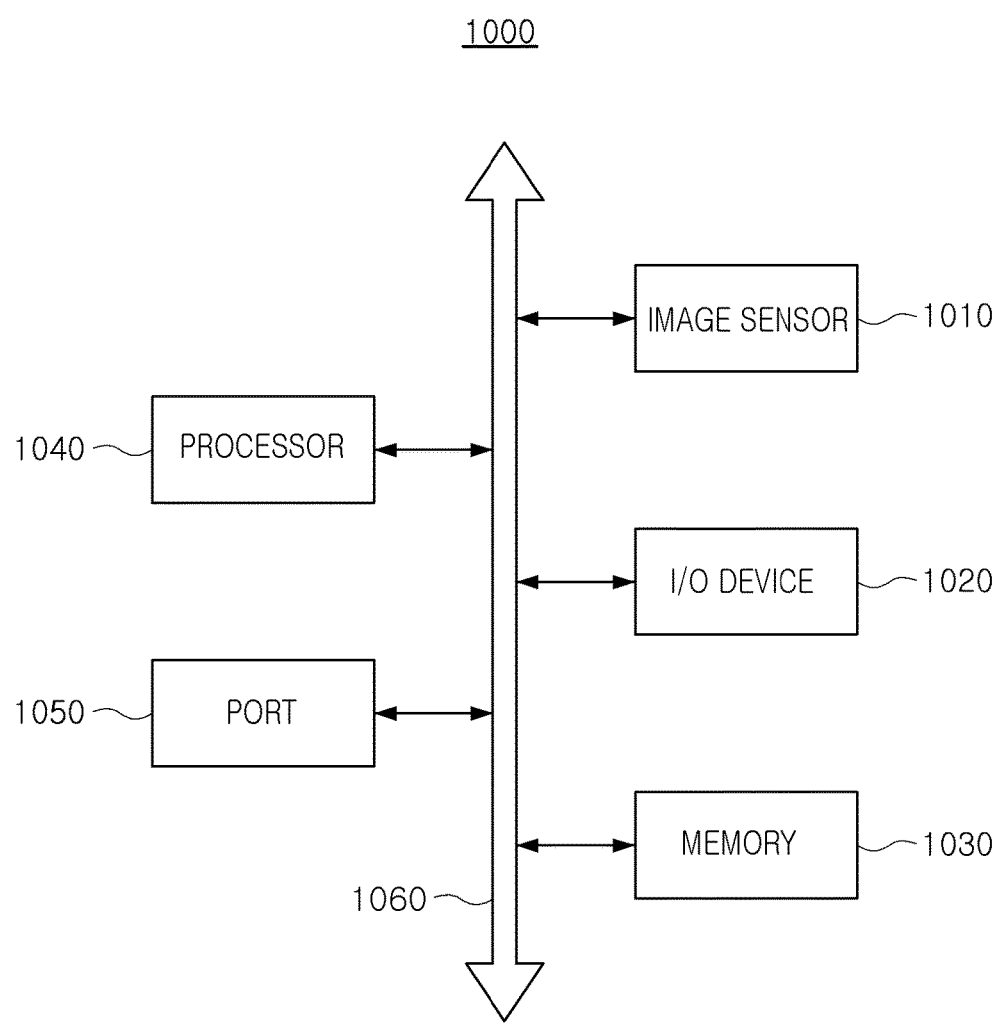
FIG. 21 is a view of an electronic device applying an image sensor according to an exemplary embodiment of the present inventive concept.

FIG. 21 is a view of an electronic device applying an image sensor according to an exemplary embodiment of the present inventive concept.

With reference to FIG. 21, an image sensor 1010, according to an exemplary embodiment, is part of a computer device 1000. The computer device 1000, according to the exemplary embodiment illustrated in FIG. 21, includes an input/output (I/O) device 1020, a memory 1030, a processor 1040, and a port 1050, in addition to the image sensor 1010. In addition, the computer device 1000 may further include a wired/wireless communications device and a power supply device. Among components illustrated in FIG. 21, the port 1050 may be provided for the computer device 1000 to communicate with a video card, a sound card, a memory card, and a universal serial bus (USB) device. The computer device 1000 may be a smartphone, a tablet PC, a smart wearable device, a general desktop computer, or a laptop computer.

The processor 1040 may perform a certain operation, a command, or task. The processor 1040 may be implemented by a central processing unit (CPU) or a microprocessor unit (MCU), and may communicate with the memory 1030, the I/O device 1020, the image sensor 1010, and other devices connected to the port 1050, through a bus 1060.

The memory 1030 may be provided as a storage medium, storing data necessary for operations of the computer device 1000, or multimedia data. The memory 1030 may include a volatile memory, such as a random access memory (RAM), or a non-volatile memory, such as a flash memory. In addition, the memory 1030 may include at least one of a solid state drive (SSD), a hard disk drive (HDD), and an optical disk drive (ODD), as a storage device. The I/O device 1020 may include an input device, such as a keyboard, a mouse, and a touchscreen, and an output device, such as a display and an audio output unit, provided to a user.

The image sensor 1010 may be connected to the processor 1040 through the bus 1060 or through other communications units. The processor 1040 may perform a function of the image processor 30 illustrated in FIG. 1. The image sensor 1010 may be implemented according to various exemplary embodiments described above.

In other words, the image sensor 1010 may include a plurality of pixels, where two or more pixels disposed adjacently to each other form a group of pixels. Pixel circuits included in each of the pixels in a single pixel group may share a single column line, thus detecting a pixel voltage from the pixel circuits included in the same pixel during each scan period. Thus, since, in a case in which the pixel voltage is detected, a coupling component generated in an organic photodiode and a semiconductor photodiode, alternately stacked in the pixels, may be effectively removed, an occurrence of fixed pattern noise in a horizontal direction may be suppressed. In addition, since the pixel voltage may be prevented from being detected from the pixel circuits included in different pixels in each scan period, a process of rearranging image data may be simplified.

As set forth above, according to at least one exemplary embodiment of the present inventive concept, a feedback reset operation and a read-out operation are simultaneously performed in pixels connected to respective different row lines during a horizontal period. Thus, since sufficient time required for each of the feedback reset operation and the read-out operation may be secured, a noise component having a reset voltage may be effectively removed, and a high-speed read-out operation may be implemented. In addition, an effect of a reset noise component may be minimized in such a manner that the reset voltage is stored in a frame memory in advance, and a pixel voltage detected during a read-out operation is compared with the reset voltage stored in the frame memory.

While exemplary embodiments have been shown and described above, it will be apparent to those skilled in the art that various modifications and variations can be made to these embodiments without departing from the scope of the present inventive concept.

What is claimed is:

1. An image sensor, comprising:
   a photoelectric device configured to generate an electric charge from light;
   a feedback device configured to generate a reset voltage using a predetermined reference voltage; and
   a pixel circuit configured to generate a pixel voltage using the reset voltage and the electric charge, set the reset voltage to the reference voltage using the feedback device during a first period, and output the pixel voltage and the reset voltage during a second period,
   wherein the pixel circuit comprises a reset transistor and a driving transistor,
   wherein the feedback device comprises an operational amplifier including a first input terminal connected to an output of the driving transistor, a second input terminal receiving the reference voltage, and an output terminal providing the reset voltage to the reset transistor.

2. The image sensor of claim 1, wherein the pixel circuit comprises a first selection transistor turned on during the first period to set the reset voltage to the reference voltage, and a second selection transistor turned on during the second period to output the pixel voltage and the reset voltage.

3. The image sensor of claim 2, further comprising a sampling circuit detecting the reset voltage and the pixel voltage during the second period.

4. The image sensor of claim 3, wherein the sampling circuit is connected to the second selection transistor by a first switch and receives the reference voltage by a second switch.

5. The image sensor of claim 4, further comprising a capacitor connected to at least one among input terminals of the sampling circuit.

6. The image sensor of claim 4, wherein the sampling circuit detects the pixel voltage while the first switch is turned on and detects the reset voltage while the second switch is turned on.

7. The image sensor of claim 6, wherein the sampling circuit detects the reference voltage as the reset voltage while the second switch is turned on.

8. The image sensor of claim 2, wherein the first input terminal is an inverting input terminal connected to the first selection transistor and the second input terminal is a non-inverting input terminal receiving the reference voltage.

9. The image sensor of claim 2, wherein the pixel circuit comprises a floating diffusion node accumulating the electric charge, the reset transistor setting an electric potential of the floating diffusion node to the reset voltage in response to a reset control signal, and the driving transistor generating the pixel voltage according to the electric potential of the floating diffusion node.

10. The image sensor of claim 9, wherein a drain terminal of the reset transistor is connected to an output terminal of the feedback device, a drain terminal of the driving transistor is connected to a power source voltage, and a source terminal of the driving transistor is connected to the first selection transistor and the second selection transistor.

11. The image sensor of claim 9, wherein the driving transistor is a native transistor.

12. An image sensor, comprising:
a photoelectric device configured to generate an electric charge from light;
a feedback device configured to generate a reset voltage using a predetermined reference voltage; and
a pixel circuit configured to generate a pixel voltage using the reset voltage and the electric charge, set the reset voltage to the reference voltage using the feedback device during a first period, and output the pixel voltage and the reset voltage during a second period,
wherein the first period and the second period have a same duration, and the second period occurs after the first period.

13. The image sensor of claim 12, wherein a time difference between an end point of the first period and a starting point of the second period is inversely proportional to an intensity of the light.

14. An image sensor, comprising:
a pixel array, including a plurality of pixels arranged along a plurality of row fines and a plurality of column lines, each of the plurality of pixels having a photoelectric device receiving light and generating an electric charge, a feedback device generating a reset voltage, and a pixel circuit generating a pixel voltage using the electric charge;
a row driver configured to set the reset voltage to a predetermined reference voltage by activating the feedback device included in each of the plurality of pixels connected to a first row the among the plurality of row lines during a single horizontal period and control each of the plurality of pixels connected to a second row line different from the first row line to output the pixel voltage and the reset voltage during the single horizontal period; and
a sampling circuit configured to detect the pixel voltage and the reset voltage from each of the plurality of pixels connected to the second row line during the single horizontal period,
wherein the feedback device comprises an operation amplifier comprising a first input terminal receiving the pixel voltage, a second input terminal receiving the reference voltage, and an output terminal providing the reset voltage.

15. The image sensor of claim 14, wherein the pixel circuit comprises:
a floating diffusion node accumulating the electric charge;
a reset transistor receiving the reset voltage output by the feedback device through a drain terminal and setting an electric potential of the floating diffusion node to the reset voltage in response to a reset control signal input by the row driver;
a driving transistor generating the pixel voltage according to the electric potential of the floating diffusion node;
a first selection transistor connected to the feedback device and setting the reset voltage to the reference voltage; and
a second selection transistor outputting the pixel voltage and the reset voltage.

16. The image sensor of claim 15, wherein at least one of input terminals of the sampling circuit is connected to the second selection transistor by a first switch and connected to the reference voltage by a second switch.

17. The image sensor of claim 15, wherein the row driver turns on the reset transistor and the first selection transistor, and turns off the second selection transistor, included in each of the plurality of pixels connected to the first row line, during the single horizontal period.

18. The image sensor of claim 15, wherein the row driver turns off the reset transistor and the first selection, transistor, included in each of the plurality of pixels connected to the second row line, and turns on the second selection transistor, during the single horizontal period.

19. The image sensor of claim 14, wherein the sampling circuit samples the reference voltage as the reset voltage of each of the plurality of pixels connected to the second row line during the single horizontal period.

20. The image sensor of claim 14, wherein a number of row lines interposed between the first row line and the second row line is inversely proportional to an intensity of the light.

21. The image sensor of claim 14, wherein the reset voltage is lower than the reference voltage and the pixel voltage.

* * * * *